(12) United States Patent
Kiuchi

(10) Patent No.: US 9,470,761 B2
(45) Date of Patent: Oct. 18, 2016

(54) VOLTAGE MONITORING MODULE AND VOLTAGE MONITORING SYSTEM

(71) Applicant: Renesas Electronics Corporation, Kawasaki-shi (JP)

(72) Inventor: Hideki Kiuchi, Kawasaki (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 785 days.

(21) Appl. No.: 13/888,272

(22) Filed: May 6, 2013

(65) Prior Publication Data

US 2013/0320991 A1    Dec. 5, 2013

(30) Foreign Application Priority Data

May 30, 2012  (JP) ................................. 2012-122688

(51) Int. Cl.
*G01R 31/36*       (2006.01)

(52) U.S. Cl.
CPC .......... *G01R 31/3606* (2013.01); *G01R 31/362* (2013.01); *G01R 31/3658* (2013.01)

(58) Field of Classification Search
CPC ........................... G01R 31/3606; G01R 31/36
USPC ............................................................ 324/434
See application file for complete search history.

(56) References Cited

U.S. PATENT DOCUMENTS

| | | | | |
|---|---|---|---|---|
| 6,087,035 A * | 7/2000 | Rogers | .............. | H01M 10/4207 429/50 |
| 6,785,106 B2 | 8/2004 | Nagata | | |
| 7,248,020 B2 * | 7/2007 | Hidaka | ............ | G01R 19/16542 320/116 |
| 7,471,065 B2 * | 12/2008 | Emori | ................. | B60L 11/1855 320/116 |
| 7,528,581 B2 * | 5/2009 | Miyazaki | .............. | H02J 7/0026 320/116 |
| 7,852,047 B2 | 12/2010 | Osamura | | |
| 2008/0012570 A1 * | 1/2008 | Bucur | ............... | H01M 8/04552 324/426 |
| 2008/0238527 A1 * | 10/2008 | Bolz | ....................... | B60R 16/03 327/404 |
| 2009/0058505 A1 * | 3/2009 | Yoshio | ................ | H01M 10/425 327/535 |
| 2009/0108911 A1 * | 4/2009 | Nakahara | ............. | H03K 17/063 327/434 |

(Continued)

FOREIGN PATENT DOCUMENTS

| | | |
|---|---|---|
| JP | 2002-217370 A | 8/2002 |
| JP | 2009-095222 A | 4/2009 |
| JP | 2009-257923 A | 11/2009 |

OTHER PUBLICATIONS

Japanese Office Action dated Jan. 26, 2016 with an English translation thereof.

*Primary Examiner* — Edward Tso
*Assistant Examiner* — Dung V Bui
(74) *Attorney, Agent, or Firm* — McGinn IP Law Group, PLLC

(57) ABSTRACT

A voltage monitoring module includes voltage control circuits each connected between two adjacent input terminals and causing a current to flow to generate a voltage drop when a voltage of a k-th input terminal counted from a high potential side is higher than a voltage of a (k−1)-th input terminal; and a disconnection detection circuit that detects a disconnection between battery cells and m input terminals. The disconnection detection circuit includes an activation circuit that controls a flow of m currents flowing between the m input terminals and a ground terminal; (m−1) first switches having one end connected to each of second to m-th input terminals, and a control terminal connected to each of first to (m−1)-th input terminals, and turning on when a voltage applied to the control terminal is smaller than a predetermined value; and a memory unit connected to another end of the (m−1) first switches.

20 Claims, 24 Drawing Sheets

(56) References Cited

U.S. PATENT DOCUMENTS

2010/0283473 A1* 11/2010 Vandensande ........ H02J 7/0021
324/434

2011/0169452 A1* 7/2011 Cooper ................ H02J 7/0021
320/116

2013/0320991 A1* 12/2013 Kiuchi ............... G01R 31/3606
324/434

* cited by examiner

VOLTAGE MONITORING MODULE AND VOLTAGE MONITORING SYSTEM

CROSS-REFERENCE TO RELATED APPLICATIONS

This application is based upon and claims the benefit of priority from Japanese patent application No. 2012-122688, filed on May 30, 2012, the disclosure of which is incorporated herein in its entirety by reference.

BACKGROUND

The present invention relates to a voltage monitoring module and a voltage monitoring system, and more specifically, to a voltage monitoring module and a voltage monitoring system for an assembled battery, for example.

With the recent widespread use of hybrid cars and electric vehicles, the number of vehicles incorporating batteries to obtain power from electric power is increasing. In such vehicles, an assembled battery having a configuration in which a number of battery cells are connected in series is generally used to obtain a high voltage. The voltage of each battery cell of the assembled battery varies depending on the status of use of the vehicle, as with gasoline for gasoline cars. For this reason, a system for monitoring the voltage is necessary to monitor the state of each battery cell.

A voltage monitoring module for monitoring a voltage of each battery cell has already been proposed (Japanese Unexamined Patent Application Publication No. 2009-257923). This voltage monitoring module has a function of detecting a disconnection by utilizing a voltage drop caused by a current flowing through a protection diode upon occurrence of a disconnection. In such a typical voltage monitoring module, disconnections between each of the battery cells, which are connected in series, and the voltage monitoring module are sequentially checked for each battery cell. The configuration of the voltage monitoring module and the method for detecting a disconnection will be described in detail later.

SUMMARY

In the voltage monitoring module as described above, disconnections between each of the battery cells, which are connected in series, and the voltage monitoring module are sequentially checked for each battery cell. Accordingly, it is necessary to repeat a disconnection detection operation by a number of times corresponding to the number of battery cells. Thus, when a large number of battery cells are connected in series, it takes a longer time to detect a disconnection, resulting in a decrease in the frequency of voltage measurement of each battery cell.

Other problems to be solved and novel features of the present invention will become apparent from the following detailed description of the present invention and the accompanying drawings.

A first aspect of the present invention is a voltage monitoring module including: m input terminals respectively connected to high-potential-side terminals of m (m is an integer equal to or greater than 2) battery cells connected in series; a ground terminal that receives a voltage of a low-potential-side terminal of a lowermost battery cell of the m battery cells; (m−1) voltage control circuits that are each connected between two adjacent input terminals of the m input terminals and cause a current to flow to generate a predetermined voltage drop when a voltage of a k-th (k is an integer equal to or greater than 2 and equal to or less than m) input terminal counted from a high potential side is higher than a voltage of a (k−1)-th input terminal counted from the high potential side; and a disconnection detection circuit that detects a disconnection between each of the high-potential-side terminals of the m battery cells and each of the m input terminals. The disconnection detection circuit includes: an activation circuit that is disposed between the m input terminals and the ground terminal and controls a flow of m currents flowing between each of the m input terminals and the ground terminal; (m−1) first switches having first terminals respectively connected to the second to m-th input terminals counted from the high potential side; second terminals that output signals; and control terminals respectively connected to the first to (m−1)-th input terminals counted from the high potential side, the (m−1) first switches being configured to turn on when a voltage applied to the control terminals is smaller than a predetermined value; and a memory unit connected to each of the second terminals of the (m−1) first switches.

According to an aspect of the present invention, it is possible to provide a voltage monitoring module and a voltage monitoring system which are capable of detecting a disconnection within a short period of time.

BRIEF DESCRIPTION OF THE DRAWINGS

The above and other aspects, advantages and features will be more apparent from the following description of certain embodiments taken in conjunction with the accompanying drawings, in which:

FIG. 1 is a block diagram showing a configuration of a voltage monitoring system VMS that monitors an output voltage of an assembled battery which supplies power to an electric vehicle or the like;

Figure 12A:
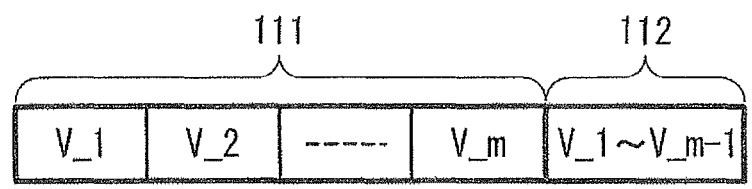
Figure 12B:
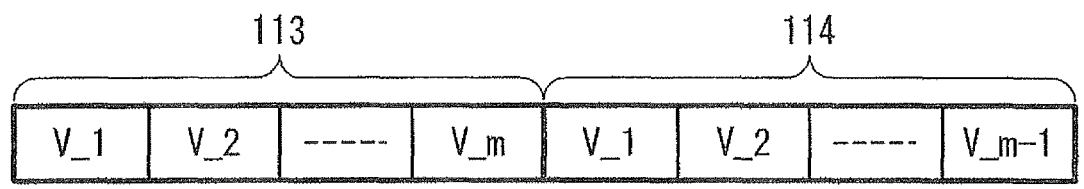
Figure 13:
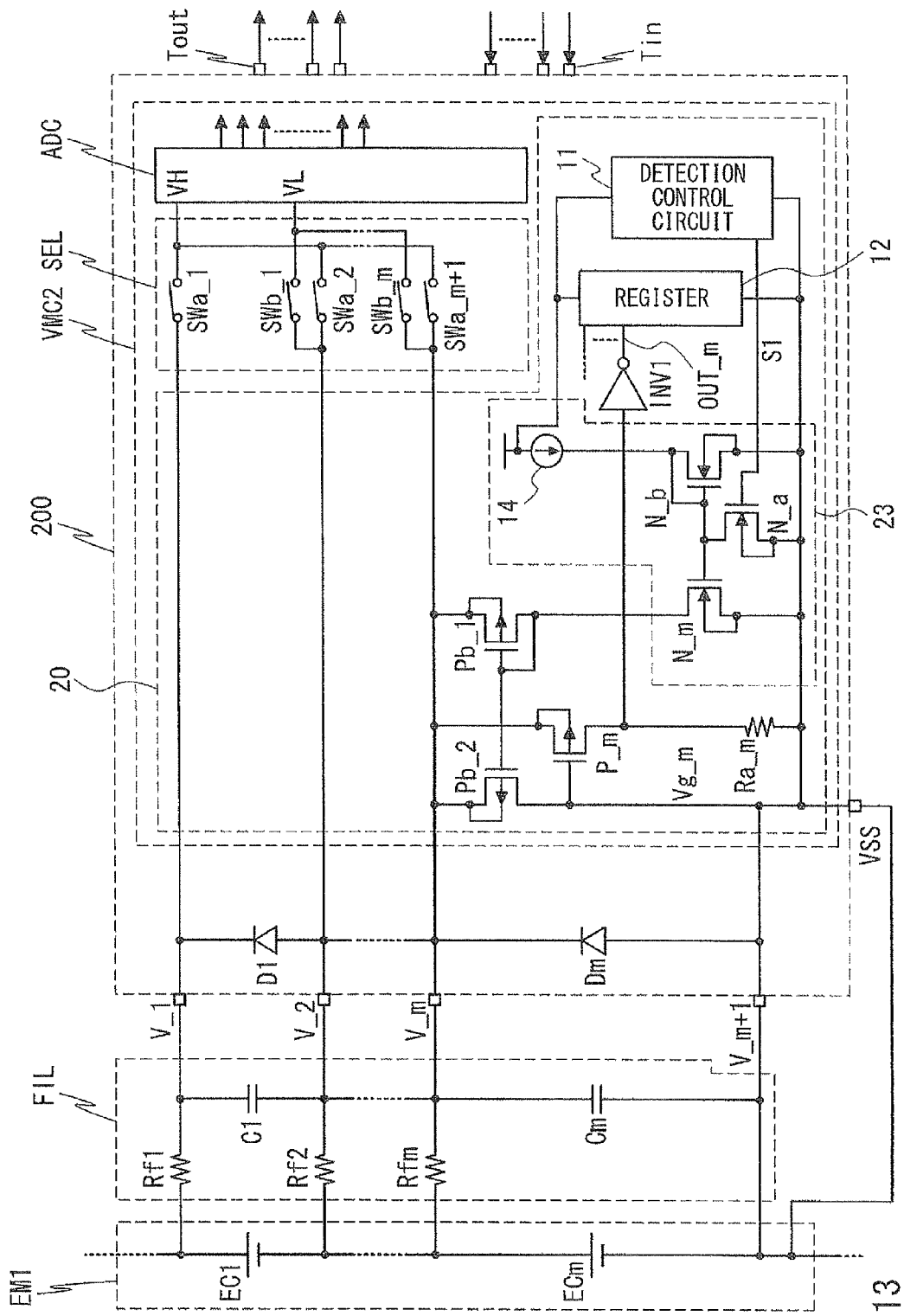
Figure 14:
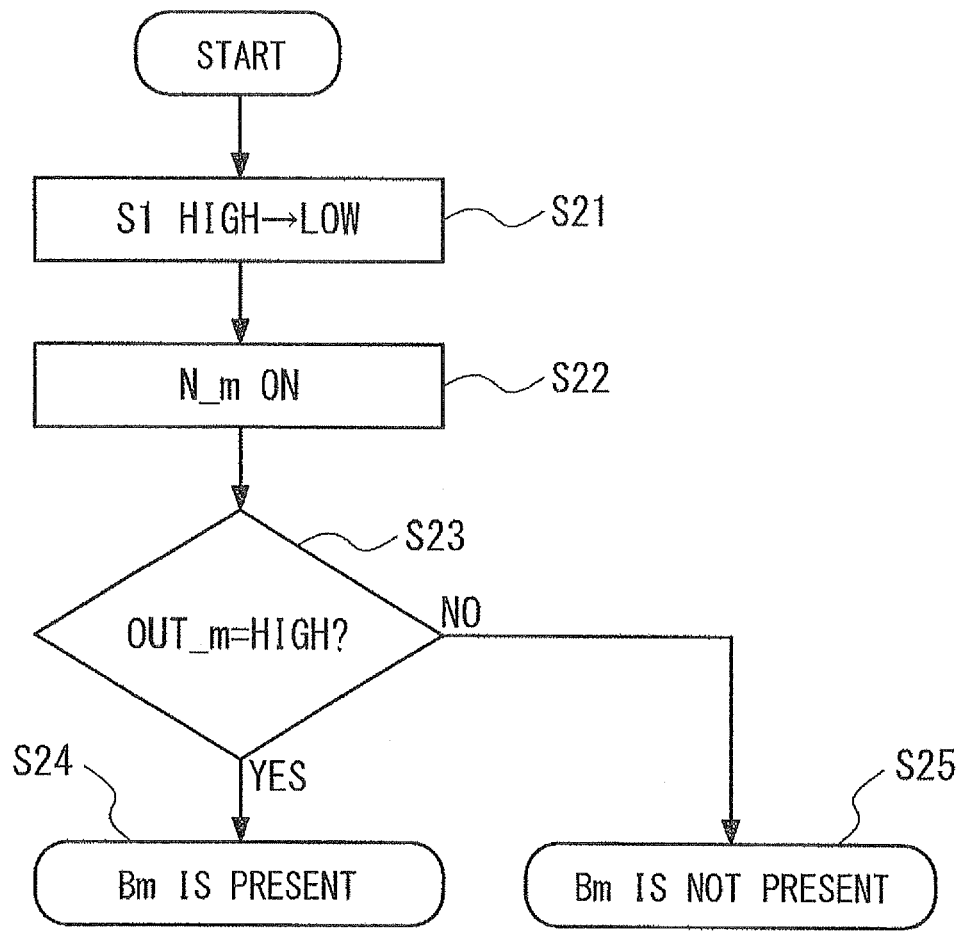
Figure 15:
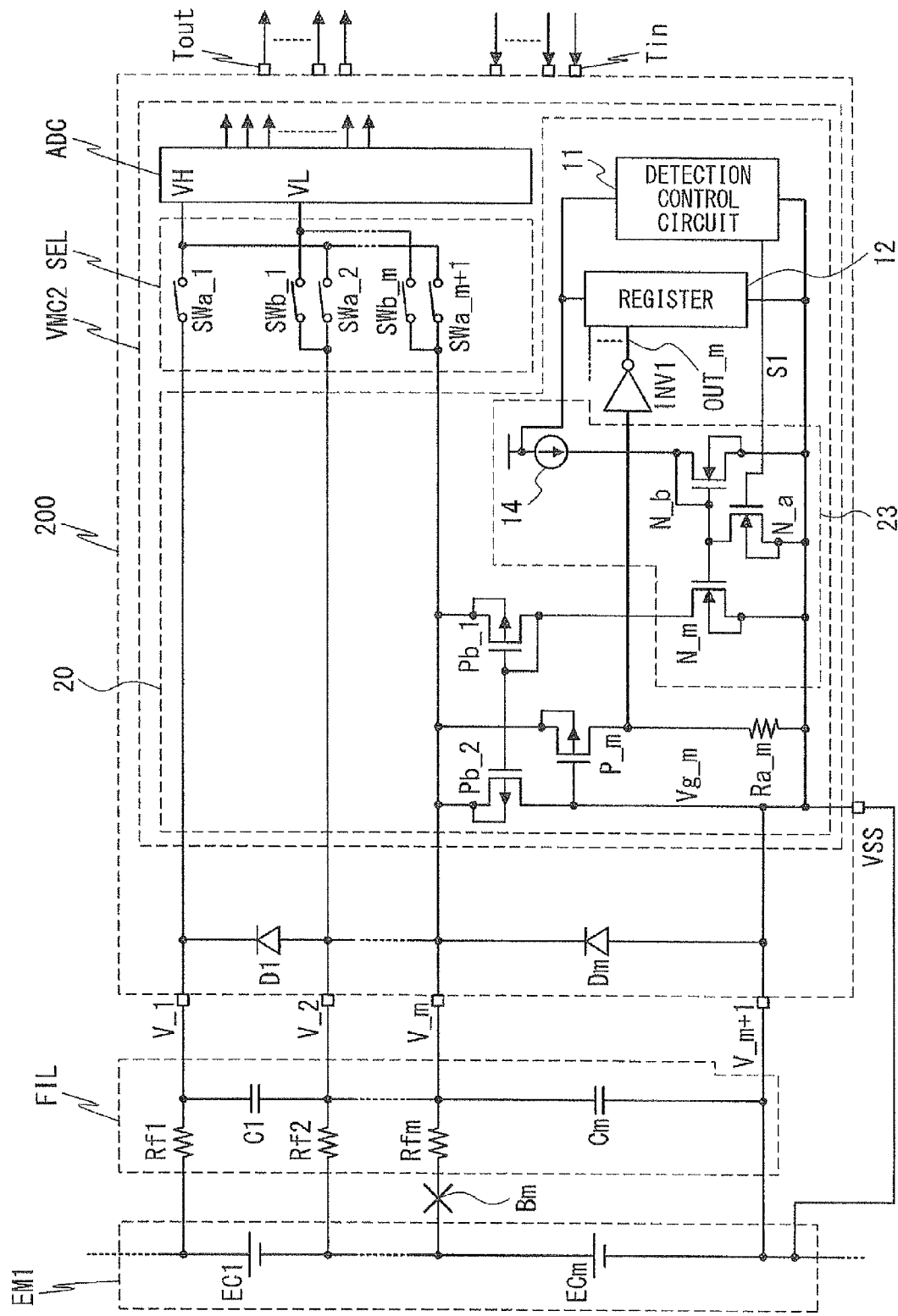
Figure 16:
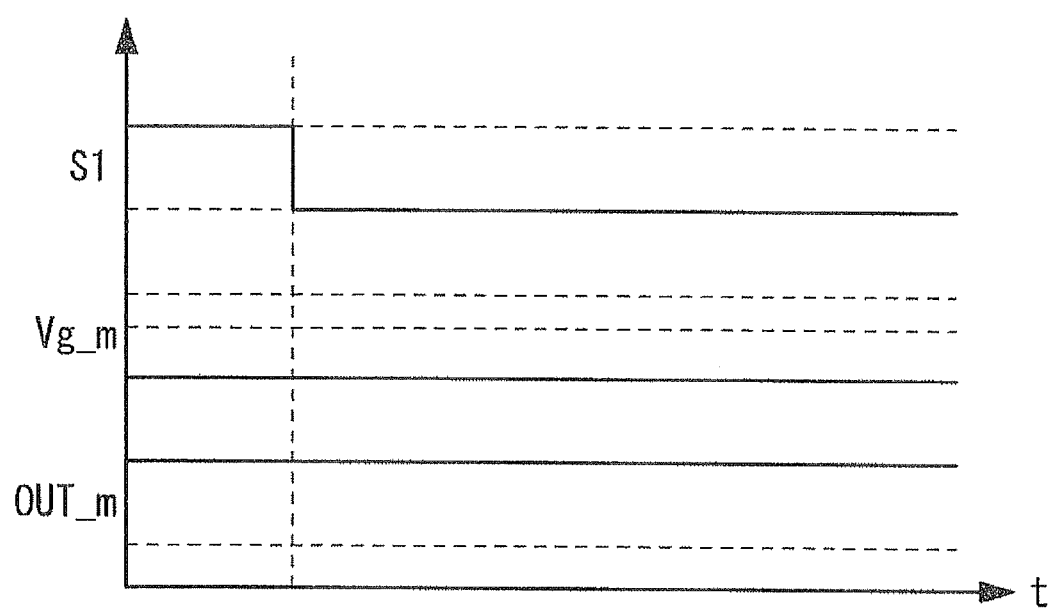
Figure 17:
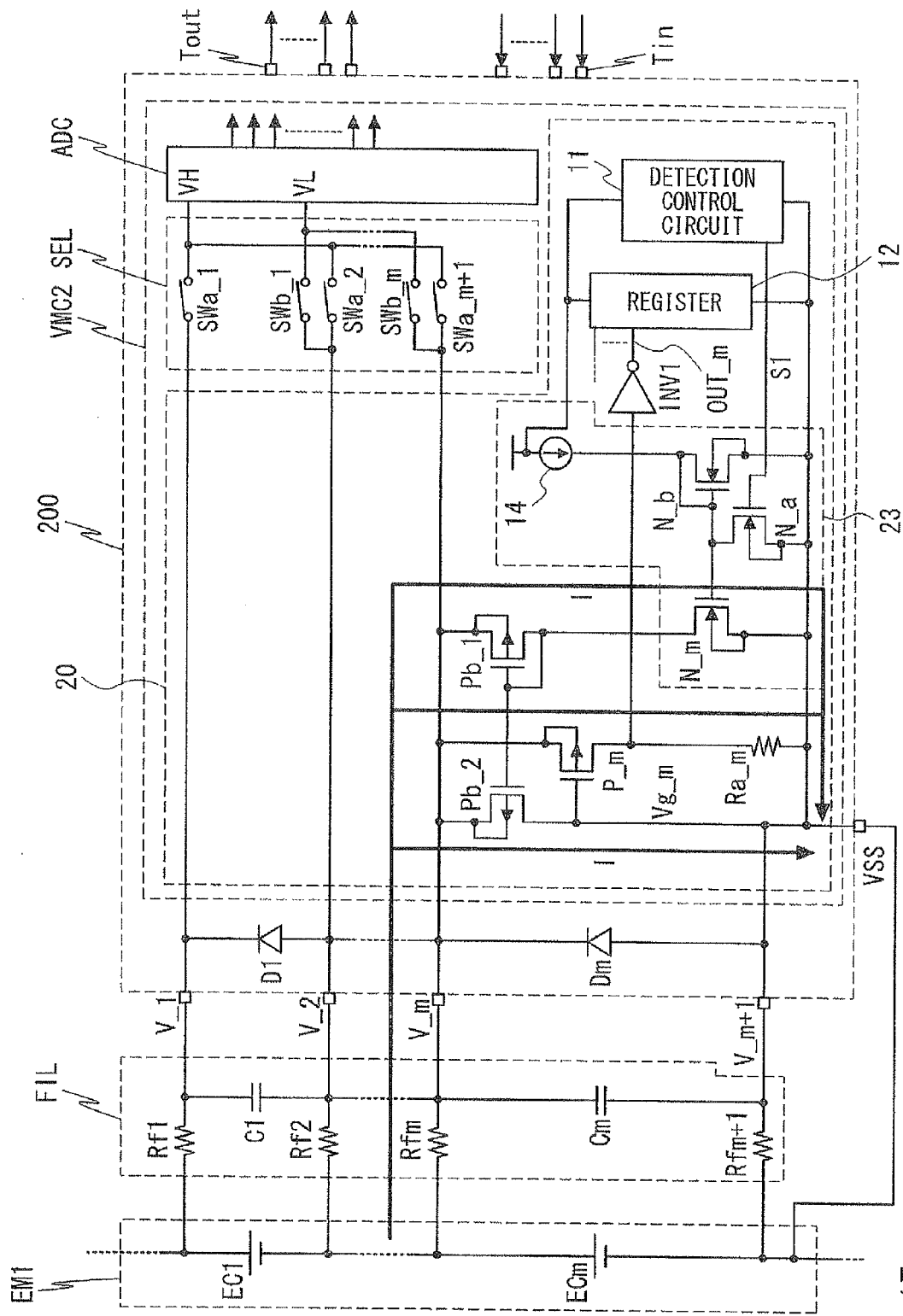
Figure 18:
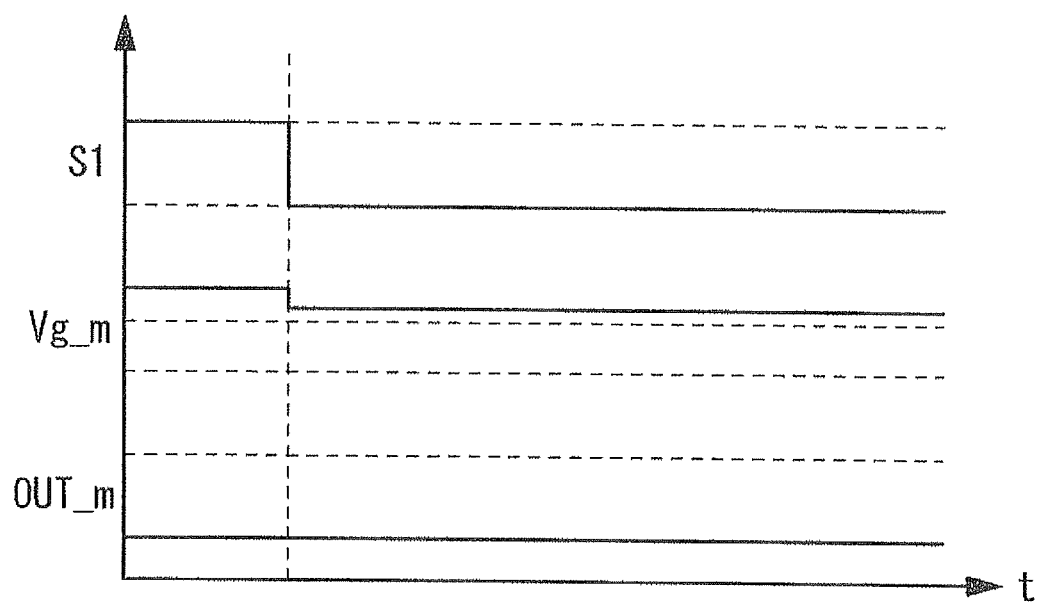
Figure 19:
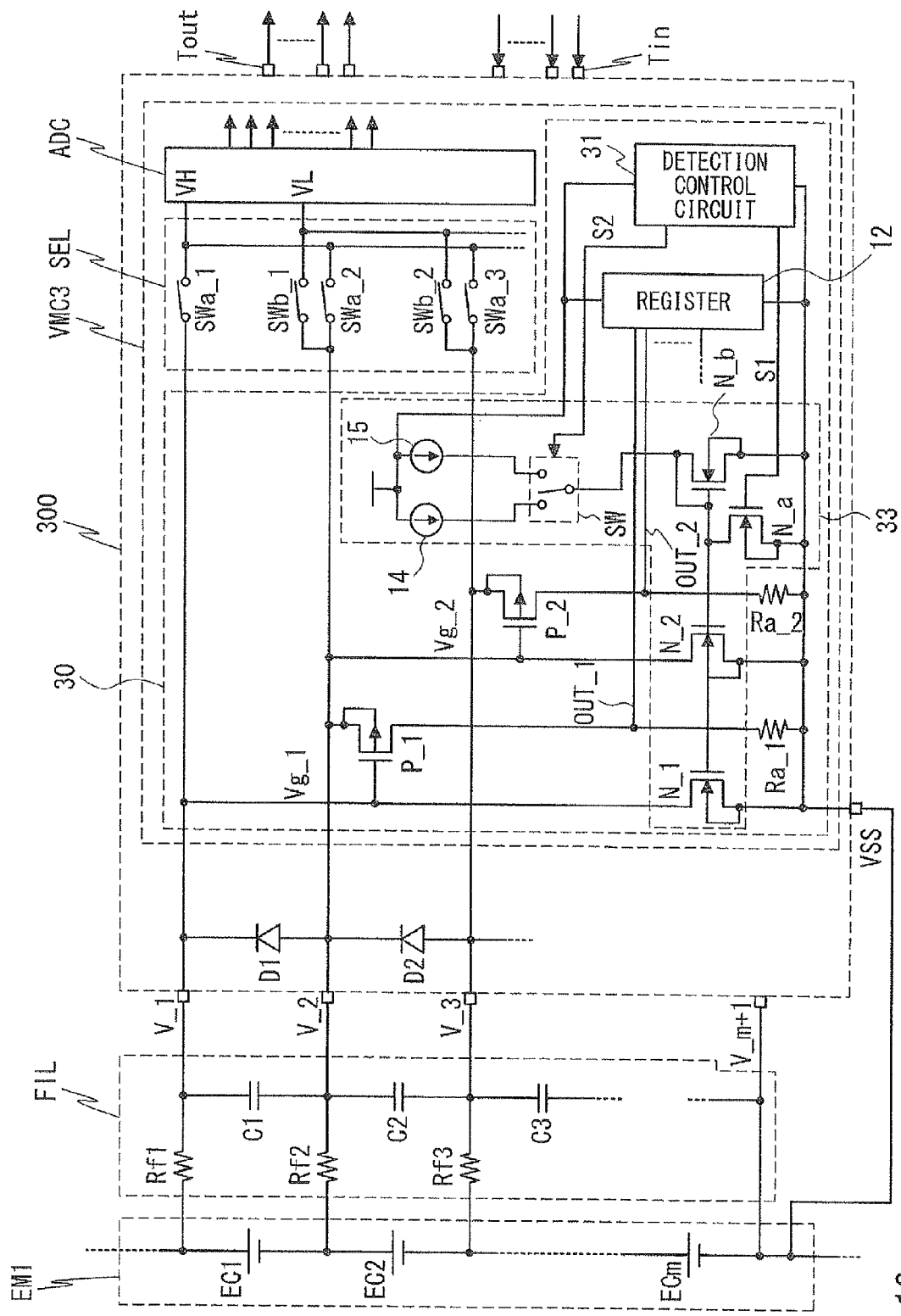
Figure 20:
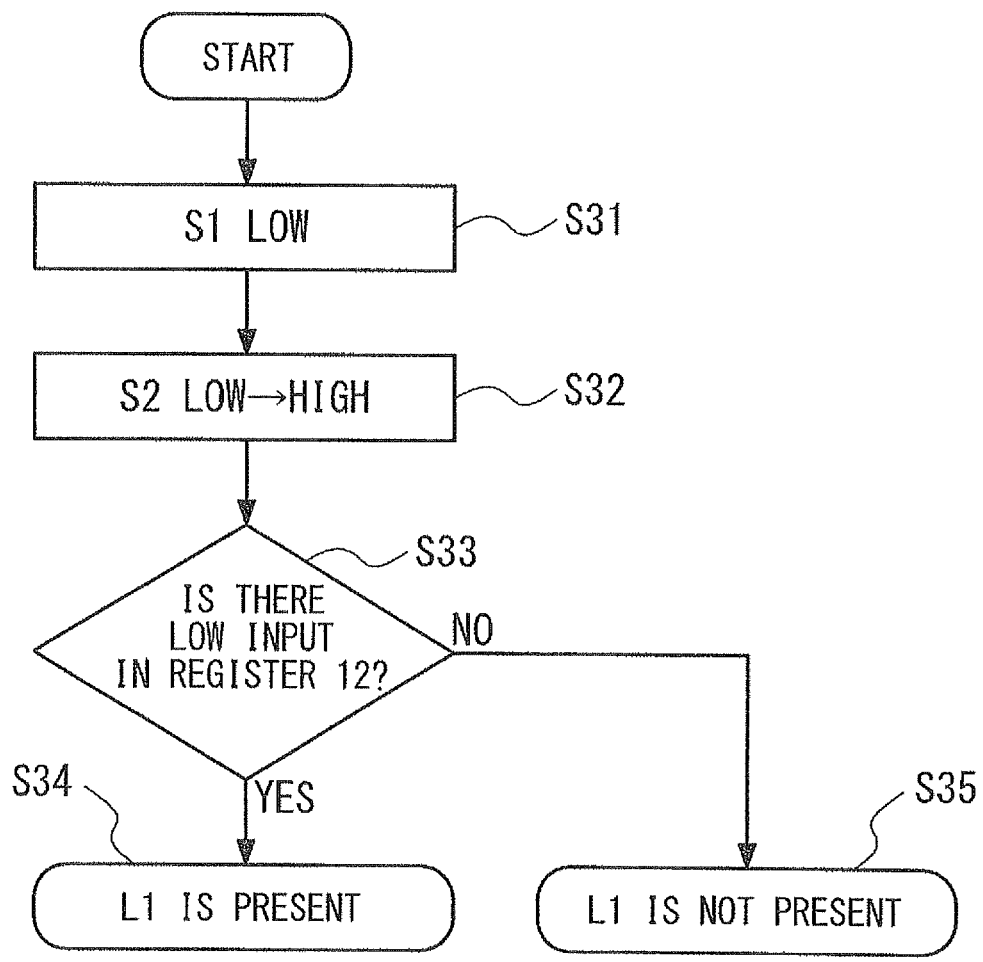
Figure 21:
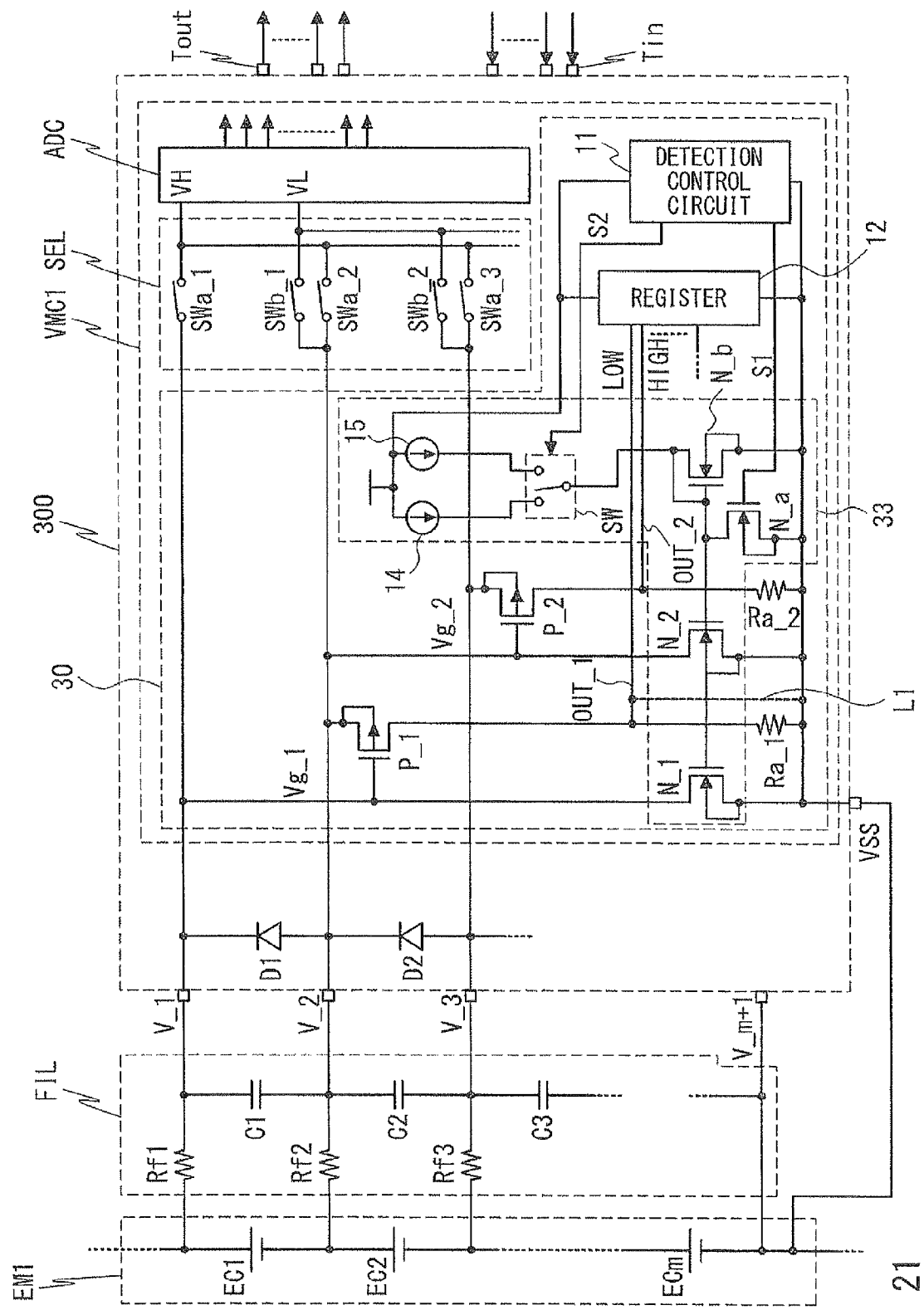
Figure 22:
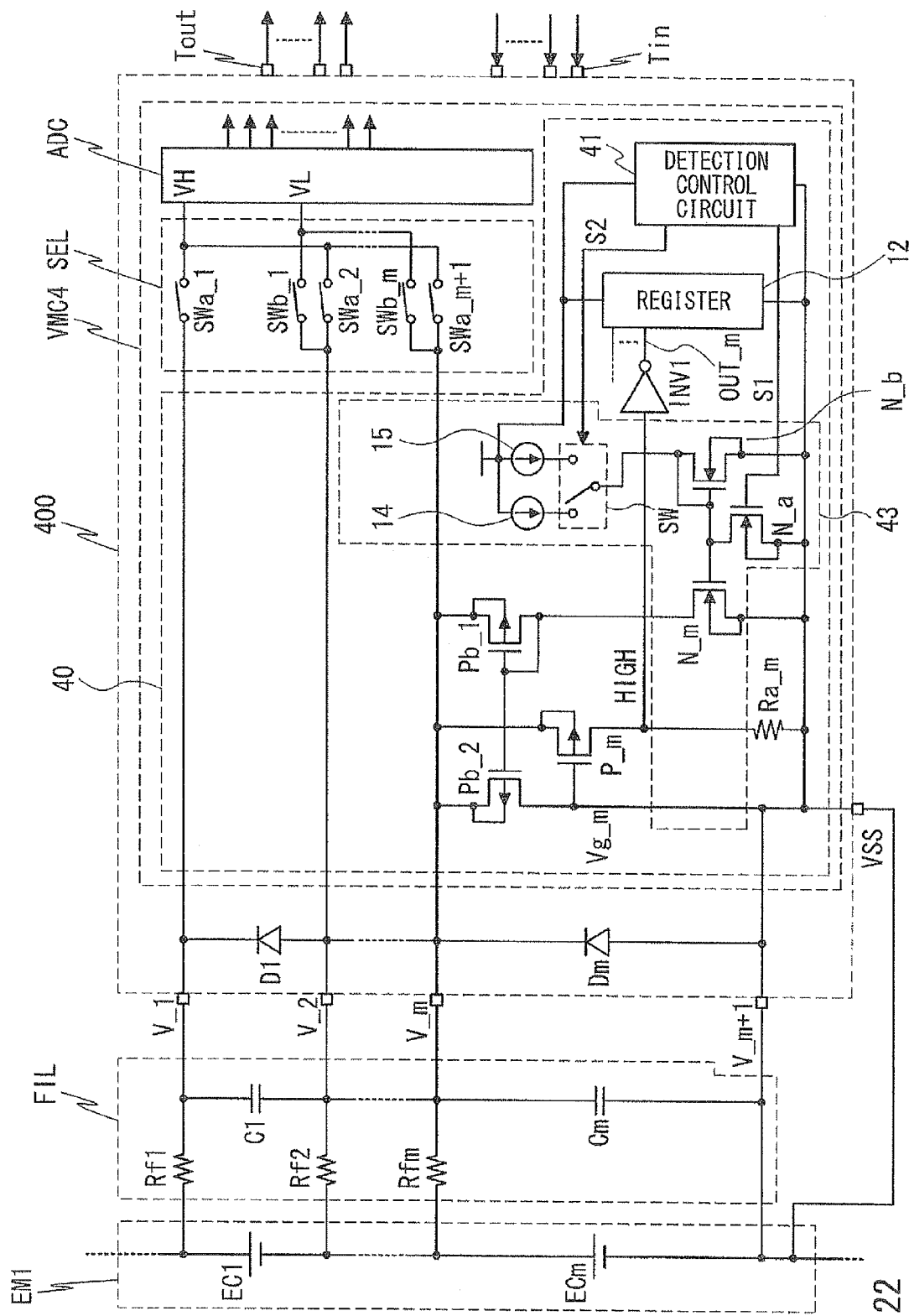
Figure 23:
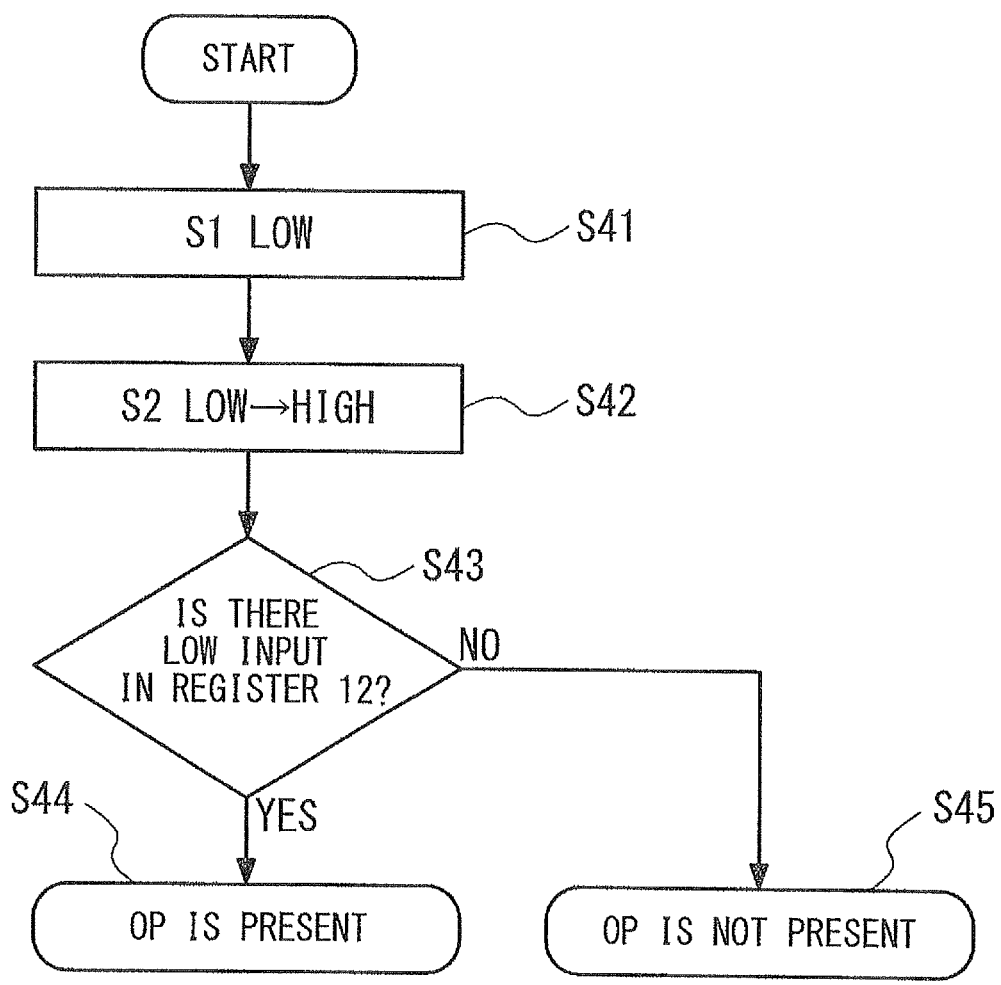
Figure 24:
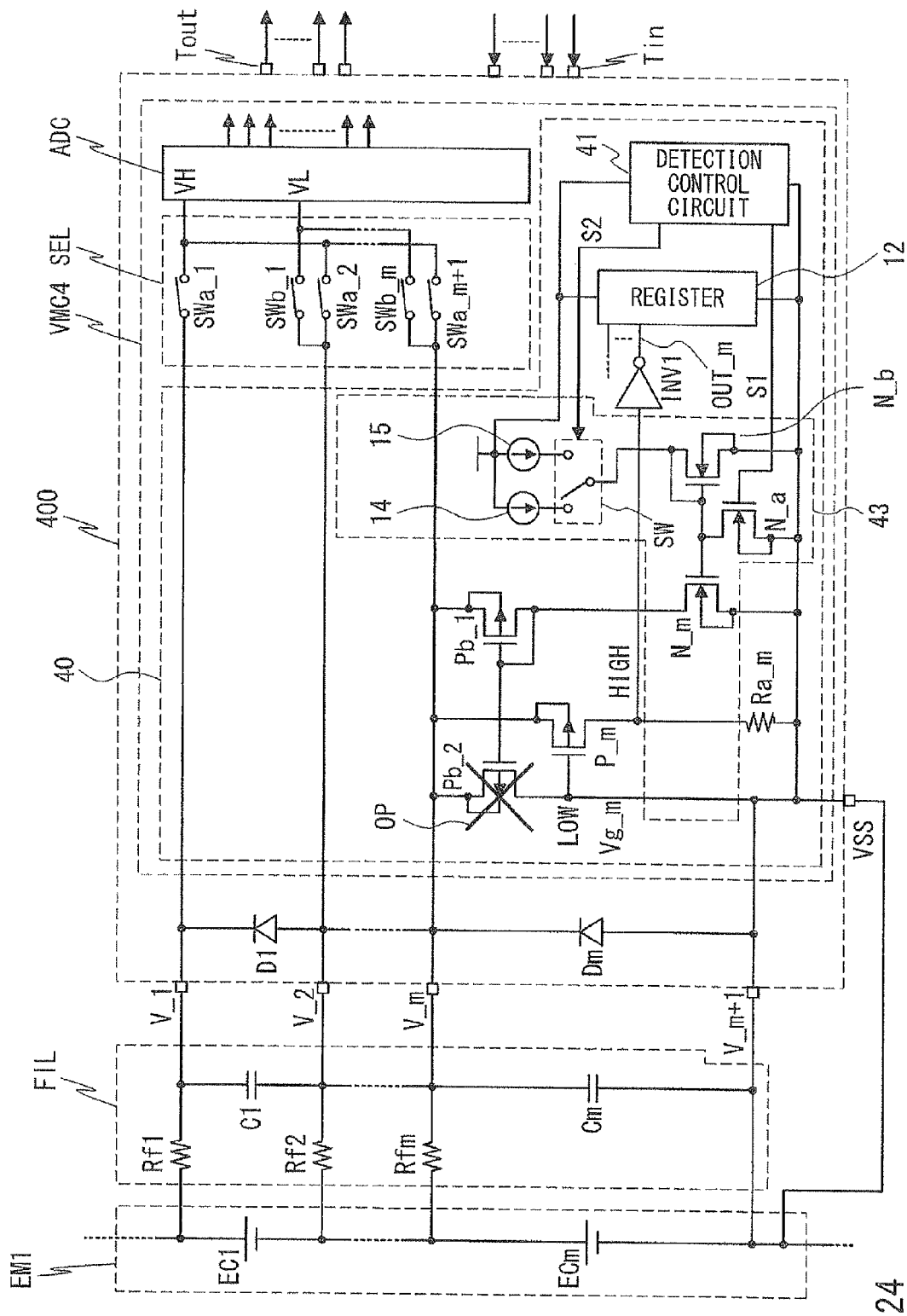

FIG. 12A is a diagram schematically showing a disconnection detection operation time of the voltage monitoring module 100 according to the first embodiment;

FIG. 12B is a diagram schematically showing a disconnection detection operation time of the typical voltage monitoring module 500;

FIG. 13 is a circuit diagram showing a configuration of a main part of a voltage monitoring module 200 according to a second embodiment;

FIG. 14 is a flowchart showing a disconnection detection operation of the voltage monitoring module 200;

FIG. 15 is a circuit diagram showing a flow of a current in the voltage monitoring module 200 when a disconnection detection circuit 20 turns on in the state where a disconnection Bm is occurring;

FIG. 16 is a timing diagram showing the disconnection detection operation of the voltage monitoring module 200 when the disconnection detection circuit 20 turns on in the state where the disconnection Bm is occurring;

FIG. 17 is a circuit diagram showing a flow of a current in the voltage monitoring module 200 when the disconnection detection circuit 20 turns on in the state where the disconnection Bm is not occurring;

FIG. 18 is a timing diagram showing the disconnection detection operation of the voltage monitoring module 200 when the disconnection detection circuit 20 turns on in the state where the disconnection Bm is not occurring;

FIG. 19 is a circuit diagram showing a configuration of a main part of a voltage monitoring module 300 according to a third embodiment;

FIG. 20 is a flowchart showing a self-diagnosis operation of the voltage monitoring module 300;

FIG. 21 is a circuit diagram of the voltage monitoring module 300 when a leakage failure L1 occurs in a disconnection detection circuit;

FIG. 22 is a circuit diagram showing a configuration of a main part of a voltage monitoring module 400 according to a fourth embodiment;

FIG. 23 is a flowchart showing a self-diagnosis operation of the voltage monitoring module 400; and FIG. 24 is a circuit diagram of the voltage monitoring module 400 when an open failure OP occurs in a disconnection detection circuit 40.

DETAILED DESCRIPTION

Hereinafter, embodiments of the present invention will be described with reference to the drawings. In the drawings, the same elements are denoted by the same reference numerals, and a repeated explanation is omitted as needed.

Figure 1:
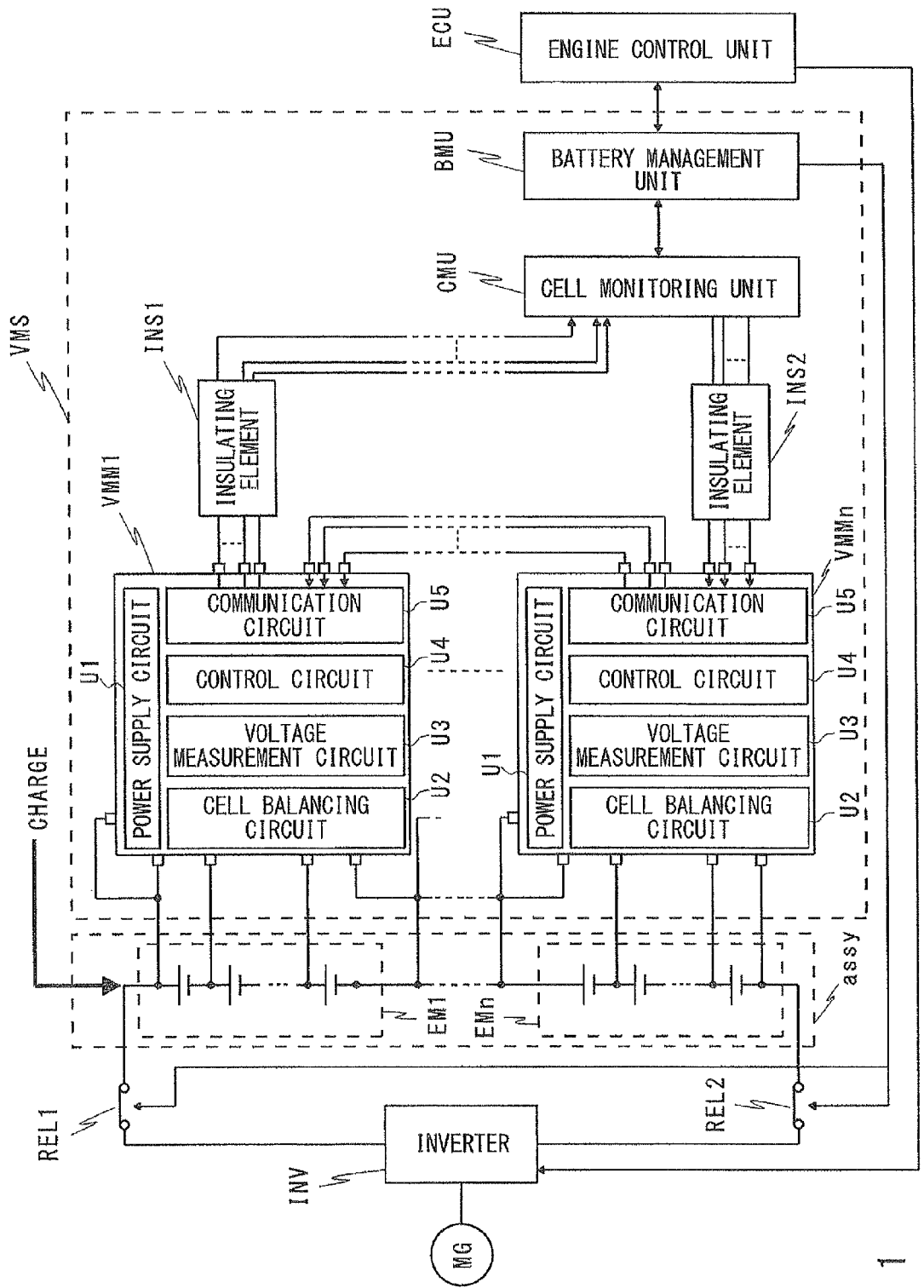

First, as a premise for understanding embodiments of the invention, a voltage monitoring system that monitors an output voltage of an assembled battery which supplies power to an electric vehicle or the like will be described. Referring first to FIG. 1, an outline of a configuration of a voltage monitoring system VMS that monitors an output voltage of an assembled battery which supplies power to an electric vehicle or the like will be described. FIG. 1 is a block diagram showing the configuration of the voltage monitoring system VMS that monitors an output voltage of an assembled battery which supplies power to an electric vehicle or the like. The voltage monitoring system VMS includes voltage monitoring modules VMM1 to VMMn (n is an integer equal to or greater than 2), insulating elements INS1 and INS2, a cell monitoring unit CMU, and a battery management unit BMU. Each of the cell monitoring unit CMU and the battery management unit BMU is configured of a microcomputer (hereinafter, MCU: Micro Computing Unit), for example. Each of the voltage monitoring modules VMM1-VMMn has a power supply circuit U1, a cell balance circuit U2, a voltage measurement circuit U3, a control circuit U4, a communication circuit U5.

In the voltage monitoring system VMS, each of the voltage monitoring modules VMM1 to VMMn monitors a voltage of an assembled battery assy. The assembled battery assy includes n battery modules EM1 to EMn which are connected in series. Each of the battery modules EM1 to EMn includes m (m is an integer equal to or greater than 2) battery cells connected in series. That is, in the assembled battery assy, (m×n) battery cells are connected in series. This allows the assembled battery assy to obtain a high output voltage.

The cell monitoring unit CMU is connected to a communication input terminal of the voltage monitoring module VMMn through the insulating element INS2, and is also connected to a communication output terminal of the voltage monitoring module VMM1 through the insulating element INS1. Each of the insulating elements INS1 and INS2 is configured of a photocoupler, for example, and electrically isolates the voltage monitoring modules VMM1 to VMMn from the cell monitoring unit CMU. This prevents the cell monitoring unit CMU from being damaged due to application of a high voltage to the cell monitoring unit CMU from the assembled battery assy upon occurrence of a failure, for example.

The cell monitoring unit CMU is further connected to the battery management unit BMU. The cell monitoring unit CMU calculates output voltages of the battery cells from the voltage monitoring results of the voltage monitoring modules VMM1 to VMMn, and notifies the battery management unit BMU of the calculated output voltages. Further, the cell monitoring unit CMU controls the operation of each of the voltage monitoring modules VMM1 to VMMn according to an instruction from the battery management unit BMU. The battery management unit BMU is further connected to an engine control unit ECU. The battery management unit BMU controls the operation of the voltage monitoring system VMS according to the output voltage of each battery cell, which is notified from the cell monitoring unit CMU, and the instruction from the engine control unit ECU. The battery management unit BMU notifies the engine control unit ECU of information on the states of the voltage monitoring system VMS and the assembled battery assy, for example. The operation of each of the cell monitoring unit CMU and the battery management unit BMU will be described in detail in the description related to the operation of the voltage monitoring system VMS which is described later.

Figure 2:
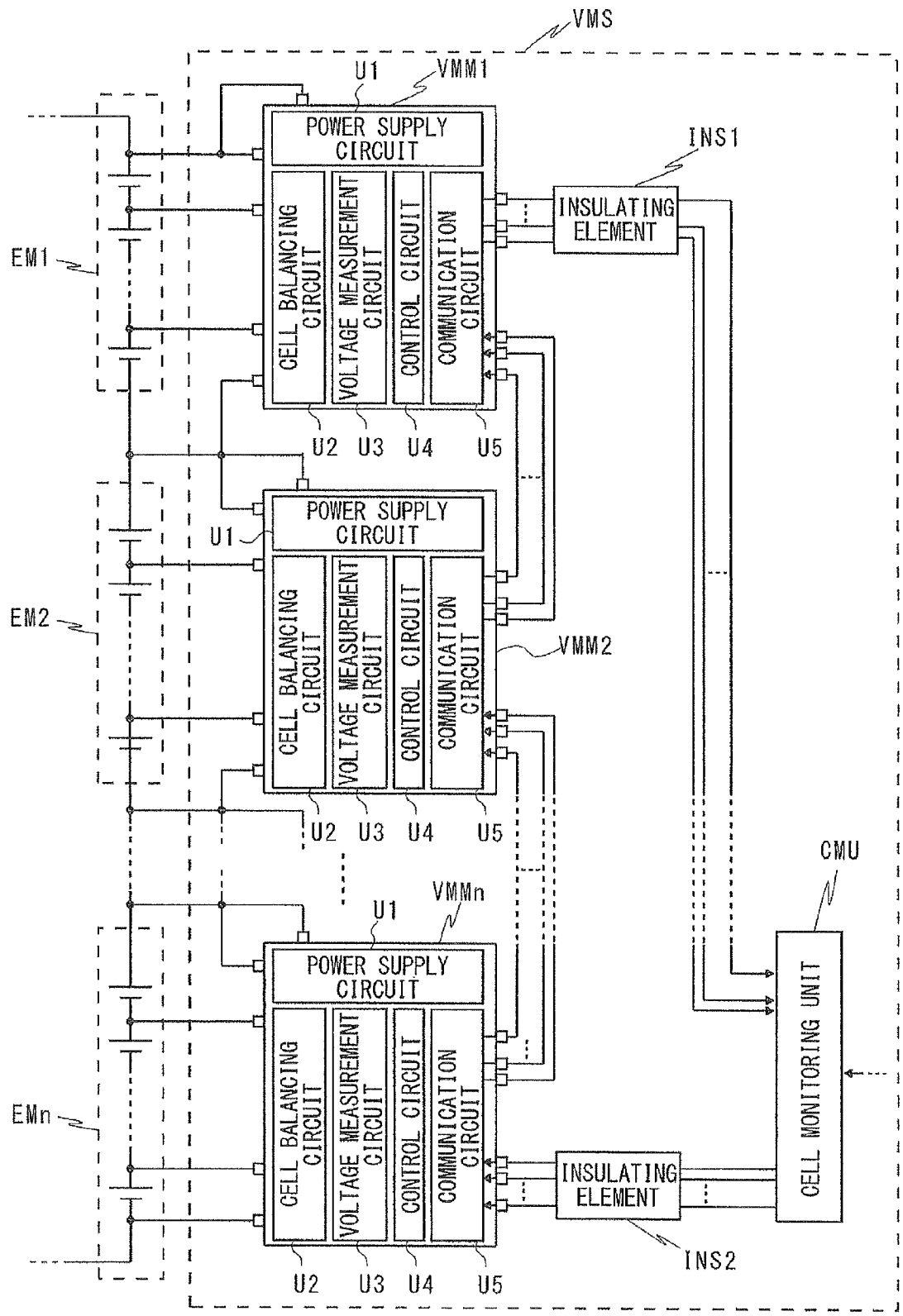
FIG. 2 is a block diagram of a main part of the voltage monitoring system VMS and shows connection relationships between voltage monitoring modules VMM1 to VMMn and a cell monitoring unit CMU.

Referring next to FIG. 2, connection relationships between the voltage monitoring modules VMM1 to VMMn and the cell monitoring unit CMU will be described. FIG. 2 is a block diagram of a main part of the voltage monitoring system VMS and shows connection relationships between the voltage monitoring modules VMM1 to VMMn and the cell monitoring unit CMU. The voltage monitoring modules VMM1 to VMMn are respectively connected to the battery modules EM1 to EMn, and monitor the respective voltages received from the battery modules EM1 to EMn. The voltage monitoring modules VMM1 to VMMn are configured as a daisy chain. The outputs of communication circuits U5 of the voltage monitoring modules VMM2 to VMMn are respectively connected to the inputs of communication circuits U5 of the voltage monitoring modules VMM1 to VMM(n−1).

The cell monitoring unit CMU outputs a control signal to the voltage monitoring module VMMn through the insulating element INS2. Control signals for the voltage monitoring modules VMM1 to VMM(n−1) are transmitted to the voltage monitoring modules VMM1 to VMM(n−1) by using the daisy chain configuration. This allows the cell monitoring unit CMU to control the operation of each of the voltage monitoring modules VMM1 to VMMn. The voltage monitoring modules VMM1 to VMMn output the monitoring results to the cell monitoring unit CMU through the insulating element INS1 according to the control signal from the cell monitoring unit CMU. The monitoring results from the voltage monitoring modules VMM2 to VMMn are transmitted to the cell monitoring unit CMU by using the daisy chain configuration.

Figure 3:
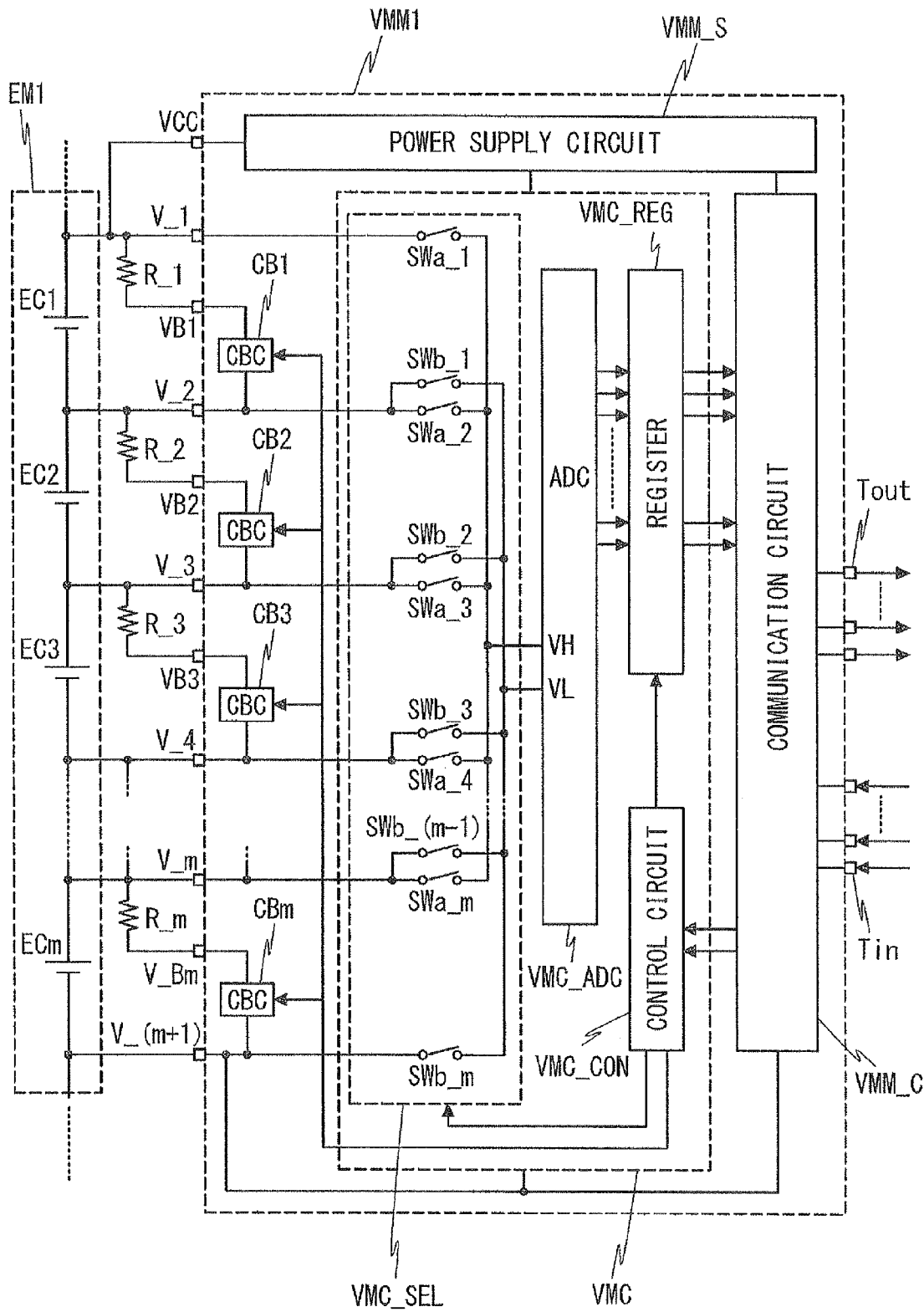
FIG. 3 is a block diagram showing a configuration of the voltage monitoring module VMM1.

Next, the configuration of each of the voltage monitoring modules VMM1 to VMMn will be described. The voltage monitoring modules VMM1 to VMMn have a similar configuration. Accordingly, the configuration of the voltage monitoring module VMM1 will be described as a typical example with reference to FIG. 3. FIG. 3 is a block diagram showing the configuration of the voltage monitoring module VMM1. The voltage monitoring module VMM1 includes a power supply circuit VMM_S, a communication circuit VMM_C, a voltage measurement circuit VMC, cell balancing circuits CB1 to CBm (m is an integer equal to or greater than 2), a power supply terminal VCC, input terminals V_1 to V_(m+1), cell balancing input terminals VB1 to VBm, a communication input terminal Tin, and a communication output terminal Tout. The power supply circuit VMM_S corresponds to the power supply circuit U1. The cell balance circuits CB1-CBm correspond to the cell balance circuit U2. The voltage measurement circuit VMC corresponds to the voltage measurement circuit U3. The communication circuit VMM_C corresponds to the communication circuit U5.

In the battery module EM1, battery cells EC1 to ECm are connected in series in the order from the high voltage side. The power supply terminal VCC of the voltage monitoring module VMM1 is connected to the high voltage side of the battery cell EC1. The low voltage side of the battery cell ECm is connected to the input terminal V_(m+1). The voltage of each input terminal is divided in the voltage monitoring module VMM1 and is supplied as a ground voltage to each of the voltage measurement circuit VMC and the communication circuit VMM_C. Thus, the output voltage of the battery module EM1 is supplied as a power supply voltage to the voltage monitoring module VMM1. The power supply circuit VMM_S receives the power supply from the battery cell EC1 through the power supply terminal VCC. The power supply circuit VMM_S supplies the power to each of the communication circuit VMM_C and the voltage measurement circuit VMC.

The voltage measurement circuit VMC includes a selection circuit VMC_SEL, an A/D converter (Analog to Digital Converter: ADC) VMC_ADC, a register VMC_REG, and a control circuit VMC_CON. The control circuit VMC_CON corresponds to the control circuit U4. The selection circuit VMC_SEL includes switches SWa_1 to SWa_m and SWb_1 to SWb_m. The switches SWa_1 to SWa_m and SWb_1 to SWb_m are turned on/off according to a control signal from the control circuit VMC_CON. Assuming that j represents an integer ranging from 1 to m, switches SWa_j and SWb_j are simultaneously turned on in the case of measuring a voltage of a battery cell ECj. As a result, the voltage from the high-potential-side terminal of the battery cell ECj is supplied as a high-potential-side voltage VH to the A/D converter VMC_ADC through an input terminal V_j. Similarly, the voltage from the low-potential-side terminal of the battery cell ECj is supplied as a low-potential-side voltage VL to the A/D converter VMC_ADC through an input terminal V_(j+1).

The A/D converter VMC_ADC converts the values of the high-potential-side voltage VH and the low-potential-side voltage VL into voltage values which are digital values. Then, the A/D converter VMC_ADC outputs the voltage values, which are digital values, to the register VMC_REG. The register VMC_REG stores the voltage values output from the A/D converter VMC_ADC. The control circuit repeats an operation for sequentially turning on the switches SWa_1 to SWa_m and SWb_1 to SWb_m every predetermined period (for example, 10 msec). As a result, the register VMC_REG is overwritten with the voltage values, which are supplied to the input terminals V_j and V_(j+1), every predetermined period.

The communication circuit VMM_C receives the instruction from the cell monitoring unit CMU and the outputs from the other voltage monitoring modules VMM2 to VMMn through the communication input terminal Tin. The communication circuit VMM_C transfers the instruction from the cell monitoring unit CMU to the control circuit VMC_CON. The communication circuit VMM_C directly transfers the outputs from the voltage monitoring modules VMM2 to VMMn to the cell monitoring unit CMU.

A cell balancing circuit CBj and an external resistor R_j are connected between the input terminal V_j and the input terminal V_(j+1) through a cell balancing input terminal VBj. When the cell balancing circuit CBj turns on, an electrical conduction is established between the input terminal V_j and the input terminal V_(j+1). The control circuit VMC_CON controls turning on/off of the cell balancing circuits CB1 to CBm, thereby selectively discharging the battery cells EC1 to ECm.

Referring next to FIG. 1, the operation of the voltage monitoring system VMS will be described. First, an output voltage monitoring operation of each battery cell will be described. The voltage monitoring system VMS starts the output voltage monitoring operation of each battery cell according to a voltage monitoring operation start instruction from the cell monitoring unit CMU. For example, the engine control unit ECU detects the power-on of the electric vehicle, and issues an instruction for activating the voltage monitoring system VMS to the battery management unit BMU. The battery management unit BMU issues an instruction for activating the voltage monitoring modules VMM1 to VMMn to the cell monitoring unit CMU according to the instruction for activating the voltage monitoring system VMS. The cell monitoring unit CMU issues the voltage monitoring operation start instruction to the voltage monitoring modules VMM1 to VMMn according to the instruction for activating the voltage monitoring modules VMM1 to VMMn.

The operation of the voltage monitoring modules VMM1 to VMMn will be described with reference to FIG. 3. The voltage monitoring modules VMM1 to VMMn having received the voltage monitoring operation start instruction perform a similar operation. Accordingly, the operation of the voltage monitoring module VMM1 will be described below as a typical example. The voltage monitoring module VMM1 starts the voltage monitoring operation according to the voltage monitoring operation start instruction from the cell monitoring unit CMU. Specifically, the communication circuit VMM_C transfers the voltage monitoring operation start instruction from the cell monitoring unit CMU to the control circuit VMC_CON of the voltage measurement circuit VMC. The control circuit VMC_CON turns on the switches SWa_j and SWb_j according to the voltage monitoring operation start instruction. This allows each of the input terminals V_j and V_(j+1) to be connected to the A/D converter VMC_ADC. The A/D converter VMC_ADC converts the magnitude of the voltage supplied to each of the connected input terminals V_j and V_(j+1) into a voltage value which is a digital value, and writes the voltage value into the register VMC_REG.

In this example, the control circuit VMC_CON sequentially turns on the switches SWa_1 to SWa_m and SWb_1 to SWb_m within a predetermined period. In other words, a switching operation is repeated m times within the predetermined period. The predetermined period is 10 msec, for example. In this case, the voltage monitoring module VMM1 measures the values of the voltages respectively supplied to the input terminals V_j and V_(j+1) every predetermined period (10 msec). The register VMC_REG is sequentially overwritten with the values. The voltage monitoring module VMM1 continuously performs the above-mentioned voltage monitoring operation, unless the voltage monitoring module VMM1 receives an instruction from the cell monitoring unit CMU.

In the case of referring to the value of the output voltage of each battery cell to control the electric vehicle, the cell monitoring unit CMU issues a voltage value output instruction to the voltage monitoring module VMM1 according to the instruction from the battery management unit BMU. The voltage monitoring module VMM1 outputs a voltage value of a designated input terminal to the cell monitoring unit CMU according to the voltage value output instruction. Specifically, the communication circuit VMM_C transfers the voltage value output instruction from the cell monitoring unit CMU to the control circuit VMC_CON of the voltage measurement circuit VMC. The control circuit VMC_CON issues an output instruction to the register VMC_REG according to the voltage value output instruction. In this case, the control circuit VMC_CON designates, in the register VMC_REG, which of the voltage values of the input terminals is to be output. The register VMC_REG outputs the voltage value of the input terminal, which is designated upon reception of the output instruction, to the cell monitoring unit CMU through the communication circuit VMM_C according to the output instruction from the control circuit VMC_CON.

The cell monitoring unit CMU calculates the output voltage of the battery cell ECj from the voltage values of the input terminals V_j and V_(j+1) received from the voltage monitoring module VMM1. For example, the cell monitoring unit CMU can calculate the output voltage of the battery cell EC1 from the difference between the voltage of the input terminal V_1 and the voltage of the input terminal V_2. After that, the cell monitoring unit CMU notifies the battery management unit BMU of the calculated output voltage of the battery cell in response to a request from the battery management unit BMU.

When the electric vehicle is powered off, the engine control unit ECU detects the power-off of the electric vehicle and issues an instruction for stopping the voltage monitoring system VMS to the battery management unit BMU. The battery management unit BMU issues an instruction for stopping the voltage monitoring modules VMM1 to VMMn to the cell monitoring unit CMU according to the instruction for stopping the voltage monitoring system VMS. The cell monitoring unit CMU issues a voltage monitoring operation stop instruction to each of the voltage monitoring modules VMM1 to VMMn according to the instruction for stopping the voltage monitoring modules VMM1 to VMMn. The voltage monitoring module VMM1 stops the voltage monitoring operation according to the voltage monitoring operation stop instruction from the cell monitoring unit CMU. Specifically, the communication circuit VMM_C transfers the voltage monitoring operation stop instruction from the cell monitoring unit CMU to the control circuit VMC_CON of the voltage measurement circuit VMC. The control circuit VMC_CON turns off all the switches SWa_1 to SWa_m and SWb_1 to SWb_m according to the voltage monitoring operation stop instruction. As a result, the voltage monitoring operation is stopped.

The voltage monitoring operation of each battery cell has been described above. However, since the voltage monitoring system VMS is mounted on an electric vehicle, for example, the voltage monitoring system VMS needs to operate according to the status of use of an electric vehicle or the like. Accordingly, the operation of the voltage monitoring system VMS according to the status of use of an electric vehicle will be described below.

To continuously use an electric vehicle, the assembled battery assy needs to be charged at an electricity station or the like. In the case of charging the assembled battery assy, the engine control unit ECU detects a manipulation of an operator, such as a connection of a charging plug, and issues a charging instruction for charging the assembled battery assy to the battery management unit BMU. The battery management unit BMU opens relays REL1 and REL2 according to the charging instruction from the engine control unit ECU. This allows the assembled battery assy and an inverter INV to be electrically disconnected. In this state, an external charging voltage CHARGE is supplied to the assembled battery assy through a charging plug, for example, to thereby charge the assembled battery assy.

It is generally known that overcharging or overdischarging of a secondary battery such as a battery cell leads to shortening of the lifetime of the battery cell. In a configuration in which a plurality of battery cells is connected in series as in the assembled battery assy, even when the battery cells are caused to perform similar charging and discharging operations, a variation in voltage or the like occurs due to manufacturing variations of the battery cells. If the charging and discharging operations of the assembled battery assy are repeated when such a variation is occurring, a deterioration, overcharge, or overdischarge of only a specific battery cell occurs. This results in shortening of the lifetime of the entire assembled battery assy and occurrence of a failure. For this reason, in the case of using battery cells connected in series, it is necessary to maintain a balance of the voltages of the battery cells (so-called cell balance).

The operation of each battery cell of the voltage monitoring system VMS during charging at an electricity station or the like will be described below. The output voltage monitoring operation of each battery cell and the method for calculating the output voltage of each battery cell are similar to those described above, so the description thereof is omitted as needed.

First, the battery management unit BMU issues an output voltage measurement instruction to the cell monitoring unit CMU according to the charging instruction from the engine control unit ECU. The cell monitoring unit CMU calculates output voltages of all battery cells constituting the assembled battery assy according to the output voltage measurement instruction from the battery management unit BMU, and notifies the battery management unit BMU of the calculated output voltages. The battery management unit BMU specifies a battery cell having a lowest output voltage in the assembled battery assy. For simplification of the explanation, assume herein that the battery cell EC1 of the battery module EM1 is a battery cell having a lowest output voltage in the assembled battery assy.

After that, the battery management unit BMU issues a cell balancing operation instruction to the cell monitoring unit CMU. The cell monitoring unit CMU issues a discharging instruction to each of the voltage monitoring modules VMM1 to VMMn according to the cell balancing operation instruction. The operation of the voltage monitoring module VMM1 will be described below as a typical example. In the voltage monitoring module VMM1, the control circuit VMC_CON of the voltage measurement circuit VMC receives the discharging instruction through the communication circuit VMM_C. The control circuit VMC_CON turns on the cell balancing circuits CB2 to CEm according to the discharging instruction. This allows the battery cells EC2 to ECm to be discharged.

The cell monitoring unit CMU sequentially calculates the output voltage values of the battery cells EC2 to ECm during discharging. When the output voltage of each battery cell drops to the output voltage of the battery cell EC1, the cell monitoring unit CMU issues a discharging stop instruction for stopping the discharging operation of the corresponding battery cell. The case where the output voltage of the battery cell EC2 drops to the output voltage of the battery cell EC1 due to discharging will be described below. First, the cell monitoring unit CMU detects that the output voltage of the battery cell EC2 drops to the output voltage of the battery cell EC1. Then, the cell monitoring unit CMU issues an instruction for stopping discharging of the battery cell EC2 to the voltage monitoring module VMM1.

The control circuit VMC_CON of the voltage monitoring module VMM1 receives the instruction for stopping discharging of the battery cell EC2, through the communication circuit VMM_C. The control circuit VMC_CON turns off the cell balancing circuit CB2 according to the instruction for stopping discharging of the battery cell EC2. As a result, the discharging of the battery cell EC2 is stopped and the output voltage of the battery cell EC2 becomes equal to the output voltage of the battery cell EC1. The cell monitoring unit CMU performs a similar operation to thereby allow the output voltages of the battery cells EC3 to ECm of the battery module EM1 and the output voltages of the battery cells of the battery modules EM2 to EMn to be equal to the output voltage of the battery cell EC1. Thus, the output voltages of the battery cells of the battery modules EM2 to EMn are equalized, and the cell monitoring unit CMU terminates the cell balancing operation. The cell monitoring unit CMU notifies the battery management unit BMU of the termination of the cell balancing operation.

In response to the notification of the termination of the cell balancing operation, the battery management unit BMU issues a charging start instruction to a power receiving unit (not shown) which is connected to a charging plug. As a result, the external charging voltage CHARGE is supplied to the assembled battery assy and charging of the assembled battery assy is started.

The cell monitoring unit CMU monitors the output voltage of each battery cell during charging. When the output voltage of any of the battery cells reaches a charging upper limit voltage, the cell monitoring unit CMU notifies the battery management unit BMU of an overcharge warning. The battery management unit BMU issues a charging stop instruction to the power receiving unit in response to the notification of the overcharge warning. As a result, the supply of the external charging voltage CHARGE is interrupted and the charging is stopped. To reliably prevent an occurrence of overcharge of each battery cell, the charging upper limit voltage is desirably set to a voltage value which is smaller than a threshold voltage level at the time of overcharge and which has a sufficient margin from a voltage level at the time of overcharge.

Charging characteristics of each battery cell of the battery modules EM1 to EMn vary. Accordingly, a variation occurs in the voltage value of each battery cell after charging. Thus, the cell monitoring unit CMU measures the output voltage of each battery cell so as to recognize a variation in the voltage value of each battery cell. Then, the cell monitoring unit CMU determines whether the variation in the output voltage of each battery cell falls within a prescribed range, and notifies the battery management unit BMU of the determination result.

When the variation in the output voltage of each battery cell does not fall within the prescribed range, the battery management unit BMU instructs the cell monitoring unit CMU to start the cell balancing operation. After completion of the cell balancing operation, the battery management unit BMU instructs the power receiving unit to start charging. On the other hand, when the variation in the output voltage of each battery cell falls within the prescribed range, the battery management unit BMU notifies the engine control unit ECU of the completion of charging. The engine control unit ECU displays the completion of charging of the assembled battery assy on a display device provided at a driver's seat, for example. As described above, the voltage monitoring system VMS monitors the output voltage of each battery cell, thereby preventing an overcharge and enabling charging of the assembled battery assy up to a fully charged state while maintaining an excellent cell balance.

Next, the case of accelerating the electric vehicle will be described. In the case of accelerating the electric vehicle, the engine control unit ECU detects a manipulation of an operator, such as depression of an accelerator pedal, and issues an acceleration instruction for accelerating the electric vehicle to each of the inverter INV and the battery management unit BMU. The operation mode of the inverter INV is switched to a DC→AC conversion mode according to the acceleration instruction from the engine control unit ECU. The battery management unit BMU closes the relays REL1 and REL2 according to the acceleration instruction from the engine control unit ECU. As a result, a DC voltage is supplied from the assembled battery assy to the inverter INV. The inverter INV converts the DC voltage into an AC voltage and supplies the AC voltage to a motor generator MG. The motor generator MG receives the AC voltage to thereby generate a driving force. The driving force generated by the motor generator MG is transmitted to drive wheels through drive shafts or the like, thereby accelerating the electric vehicle.

In the case of accelerating the electric vehicle, electric power stored in each battery cell is consumed and the output voltage of each battery cell decreases. Accordingly, it is necessary to take measures for preventing an overdischarge of each battery cell. Thus, the voltage monitoring system VMS constantly monitors the output voltage of each battery cell during traveling. For example, when the voltage of any of the battery cells is lower than a warning level voltage, the cell monitoring unit CMU issues a voltage drop warning to the battery management unit BMU. The battery management unit BMU issues a warning of a decrease in charge remaining amount of the assembled battery assy to the engine control unit ECU according to the voltage drop warning. The engine control unit ECU displays the warning of the decrease in charge remaining amount of the assembled battery assy on a display device provided at a driver's seat, for example, and informs the operator that there is a possibility of occurrence of an overdischarge in a battery cell. This allows the voltage monitoring system VMS to prompt the operator to take measures, such as stopping of traveling, to prevent an overdischarge.

If the warning of the decrease in charge remaining amount of the assembled battery assy is neglected and traveling is continued thereafter, the output voltage of each battery cell further decreases. Accordingly, to prevent an overdischarge of each battery cell, it is necessary to stop discharging of each battery cell. For example, when the voltage of any of the battery cells is lower than an emergency stop level voltage, the cell monitoring unit CMU issues an emergency stop warning to the battery management unit BMU. To reliably prevent an occurrence of overdischarge of each battery cell, the emergency stop level voltage is desirably set to a voltage value which is larger than a threshold voltage level at the time of overdischarge and which has a sufficient margin from a voltage level at the time of overdischarge.

The battery management unit BMU activates an emergency stop operation according to the emergency stop warning from the cell monitoring unit CMU. Specifically, the battery management unit BMU opens the relays REL1 and REL2 to interrupt the power supply from the assembled battery assy to the inverter INV. This results in stopping the drop of the output voltage of each battery cell. The battery management unit BMU notifies the engine control unit ECU of execution of the emergency stop operation. The engine control unit ECU displays the activation of the emergency stop operation on a display device provided at a driver's seat, for example. This reliably prevents occurrence of an overdischarge of each battery cell.

Next, the case of decelerating the electric vehicle will be described. In the case of decelerating the electric vehicle, the engine control unit ECU detects a manipulation of the operator, such as depression of a brake pedal, and issues a deceleration instruction for decelerating the electric vehicle to each of the inverter INV and the battery management unit BMU. The operation mode of the inverter INV is switched to an AC→DC conversion mode according to the deceleration instruction from the engine control unit ECU. The battery management unit BMU closes the relays REL1 and REL2 according to the deceleration instruction from the engine control unit ECU. The motor generator MG generates power by torque of tires which is transmitted through drive shafts or the like. A rotational resistance generated by the power generation is transmitted as a braking force to the drive wheels through drive shafts or the like. This results in decelerating the electric vehicle. This braking method is generally referred to as a regenerative brake operation. An AC voltage generated by the regenerative brake operation is supplied to the inverter INV. The inverter INV converts the AC voltage from the motor generator MG into a DC voltage and supplies the DC voltage to the assembled battery assy. This allows the assembled battery assy to be charged with the voltage recovered by the regenerative brake operation.

The assembled battery assy is charged during the regenerative brake operation, so that the output voltage of each battery cell rises. Accordingly, it is necessary to take countermeasures for preventing an overcharge of each battery cell. Thus, the voltage monitoring system VMS constantly monitors the output voltage of each battery cell during traveling. The cell monitoring unit CMU determines whether the output voltage of each battery cell at the time of starting the regenerative brake operation is equal to or lower than the charging upper limit voltage. When there is a battery cell having an output voltage higher than the charging upper limit voltage, the cell monitoring unit CMU issues an overcharge warning to the battery management unit BMU. The battery management unit BMU opens the relays REL and REL2 according to the overcharge warning to prevent the assembled battery assy from being charged.

Also during the charging by the regenerative brake operation, the cell monitoring unit CMU continuously monitors the output voltage of each battery cell. When a battery cell having an output voltage having reached the charging upper limit voltage is found, the cell monitoring unit CMU issues an overcharge warning to the battery management unit BMU. The battery management unit BMU opens the relays REL1 and REL2 according to the overcharge warning to prevent the assembled battery assy from being charged. This makes it possible to prevent the assembled battery assy from being overcharged.

The operation of the voltage monitoring system VMS has described above on the premise that the voltage of each battery cell can be detected normally. In practice, however, the output voltage of each battery cell cannot be detected normally in some cases. For example, if a line between the voltage monitoring modules VMM1 to VMMn and the assembled battery assy is disconnected, a voltage at a disconnected portion abnormally drops or abnormally rises. This makes it impossible for the cell monitoring unit CMU to perform a normal voltage calculation. The occurrence of such a disconnection makes is impossible to monitor the output voltage of each battery cell, which is an object of the voltage monitoring system VMS. Therefore, there is a need to detect a disconnection failure.

Thus, the cell monitoring unit CMU preliminarily stores an appropriate range of output voltage values. When the calculated output voltage of each battery cell falls out of the appropriate range, the cell monitoring unit CMU determines that a disconnection failure has occurred. Then, the cell monitoring unit CMU notifies the battery management unit BMU of the occurrence of the disconnection failure. In response to the notification of the occurrence of the disconnection failure, the battery management unit BMU opens the relays REL1 and REL2 and disconnects the connection between the inverter INV and the assembled battery assy. This prevents a further failure from occurring in the system. Further, the battery management unit BMU notifies the engine control unit ECU of the occurrence of the disconnection failure. The engine control unit ECU displays the occurrence of the disconnection failure on a display device provided at a driver's seat, for example, and informs the operator of the occurrence of the failure. As described above, the voltage monitoring system VMS can also detect the occurrence of the disconnection failure.

Note that the configuration and operation of the voltage monitoring system VMS are illustrated by way of example only. Accordingly, the cell monitoring unit CMU and the battery management unit BMU can be integrated into one circuit block, for example. Further, a part or the whole of the functions shared by the cell monitoring unit CMU and the battery management unit BMU can be replaced with each other. Furthermore, the cell monitoring unit CMU, the battery management unit BMU, and the engine control unit ECU can be integrated into one circuit block. The engine control unit ECU enables replacement of a part or the whole of the functions of the cell monitoring unit CMU and the battery management unit BMU.

To avoid the problem caused due to the disconnection described above, the voltage monitoring modules VMM1 to VMMn are required to have a function for detecting the presence or absence of occurrence of a disconnection. A disconnection detection operation of a voltage monitoring module 500, which is a modified example of the voltage monitoring modules VMM1 to VMMn, will now be described.

Figure 4:
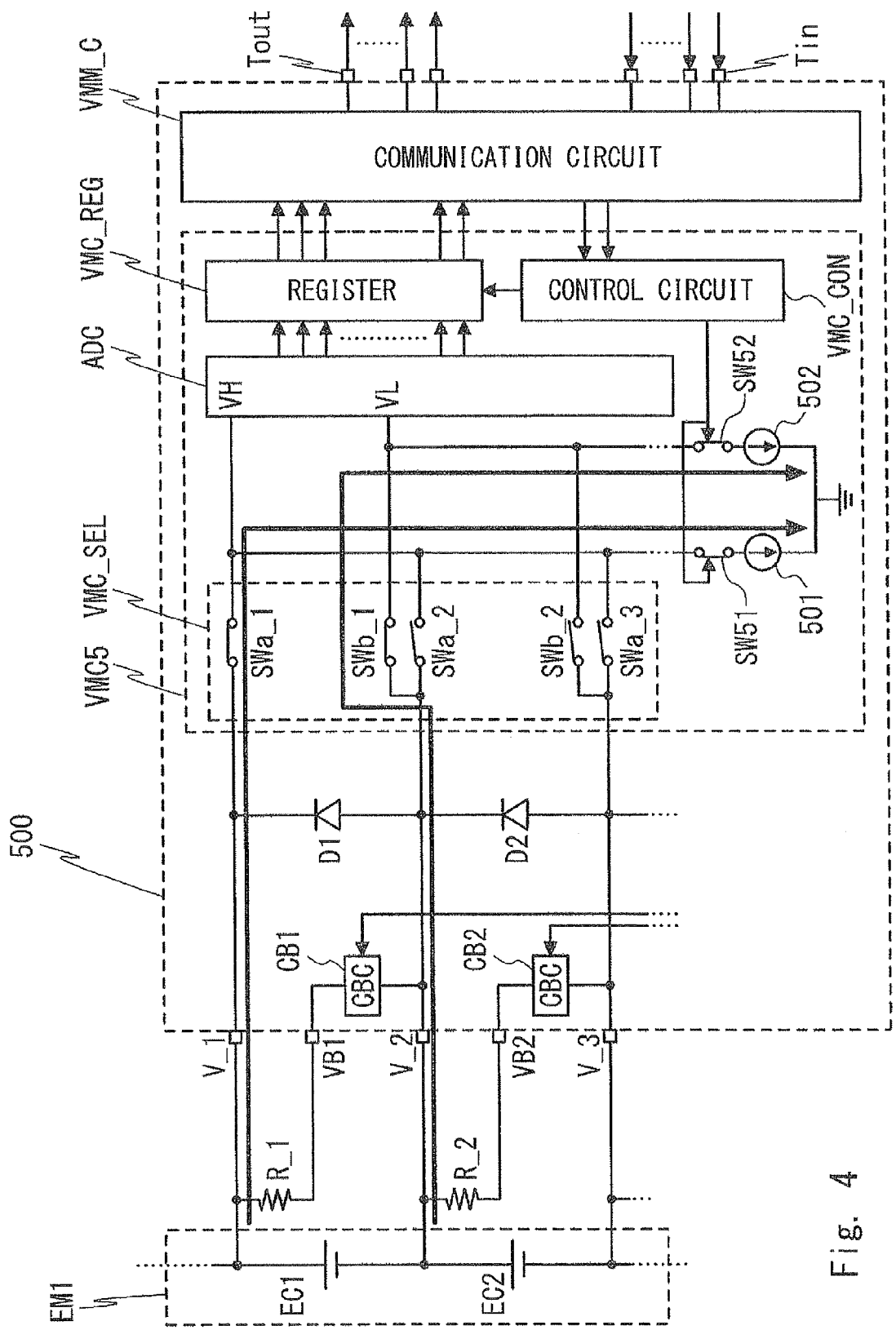
FIG. 4 is a circuit diagram showing a flow of a current in a voltage monitoring module 500 during a disconnection detection operation when a disconnection B1 is not occurring.

The disconnection detection operation of the voltage monitoring module 500 will be described below for each of the following cases: the case where a disconnection B1 is occurring between the high-potential-side terminal of the battery cell EC1 and the input terminal V_1; and the case where the disconnection B1 is not occurring therebetween. First, the case where the disconnection is not occurring between the high-potential-side terminal of the battery cell EC1 and the input terminal V_1. FIG. 4 is a circuit diagram showing a flow of a current in the voltage monitoring module 500 during the disconnection detection operation when the disconnection is not occurring. The voltage monitoring module 500 is a modified example of the voltage monitoring modules VMM1 to VMMn, and has a configuration in which protection diodes D1 to Dm, current sources 501 and 502 for detecting a disconnection, and switches SW51 and SW52 are added to the voltage monitoring modules VMM1 to VMMn. A voltage measurement circuit VMC5 shown in FIG. 4 corresponds to the voltage measurement circuit VMC of the voltage monitoring modules VMM1 to VMMn. For simplification of the explanation, FIG. 4 illustrates the components necessary to understand the configuration and operation of the voltage monitoring module 500. Specifically, in FIG. 4, the power supply circuit VMM_S is omitted, and only the circuit elements and circuit blocks associated with the input terminals V_1 to V_3, the protection diodes D1 and D2, and the cell balancing input terminals VB1 and VB2 are illustrated. The illustration of the control signal from the control circuit VMC_CON to the selection circuit VMC_SEL and to the cell balancing circuit is omitted.

First, the control circuit VMC_CON turns on the switches SW51 and SW52 and the switches SWa_1 and SWb_1 of the selection circuit VMC_SEL, and turns off the other switches. Since the disconnection B1 is not occurring between the high-potential-side terminal of the battery cell EC1 and the input terminal V_1, the voltage of the input terminal V_1 is higher than that of the input terminal V_2. Accordingly, the high-potential-side voltage VH of the A/D converter VMC_ADC (voltage of an input terminal V_1) is higher than the low-potential-side voltage VL (voltage of the input terminal V_2). When VH>VL is satisfied, the voltage of the battery cell EC1 is correctly detected. Accordingly, in this case, it can be determined that no disconnection is occurring.

Figure 5:
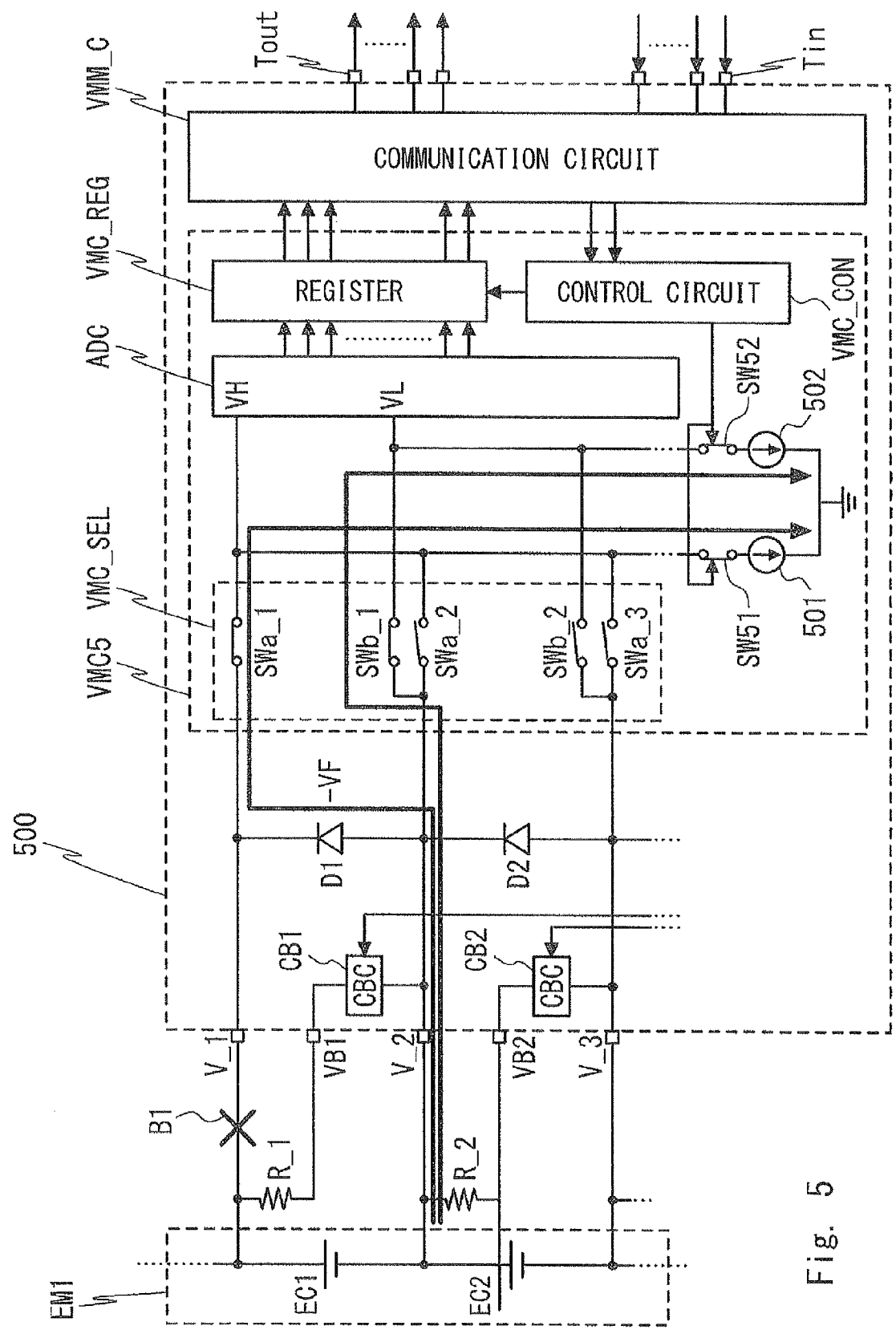
FIG. 5 is a circuit diagram showing a flow of a current in the voltage monitoring module 500 during the disconnection detection operation when the disconnection B1 is occurring.

Subsequently, the case where the disconnection B1 is occurring between the high-potential-side terminal of the battery cell EC1 and the input terminal V_1 will be described. FIG. 5 shows a flow of a current in the voltage monitoring module 500 during the disconnection detection operation when the disconnection is occurring. FIG. 5 is simplified as in FIG. 4.

The disconnection B1 is occurring between the high-potential-side terminal of the battery cell EC1 and the input terminal V_1. Accordingly, the voltage of the input terminal V_1 decreases to be lower than that of the input terminal V_2. Then, a current starts flowing through the protection diode D1. In this case, a voltage drop VF occurs in the protection diode D1. Thus, the high-potential-side voltage VH of the A/D converter VMC_ADC (voltage of the input terminal V_1) becomes a voltage obtained by subtracting the voltage drop VF from the voltage of the input terminal V_2. Accordingly, as compared with the case where no disconnection occurs, the magnitude relation between the high-potential-side voltage VH and the low-potential-side voltage VL is reversed (VH>VL). In this case, the voltage of the battery cell EC1 is not correctly detected, and it can be determined that the disconnection B1 is occurring.

As described above, the voltage monitoring module 500 can detect the disconnection B1. Similarly, the switches SWa_2 and SWb_2 of the selection circuit VMC_SEL are turned on and the other switches are turned off, thereby making it possible to detect the presence or absence of a disconnection B2 between the high-potential-side terminal of the battery cell EC2 and the input terminal V_2. That is, sequentially changing the switches to be turned on enables detection of the presence or absence of each of the disconnections B1 to Bm between the battery cells EC1 to ECm and the input terminals V_1 to V_m.

In other words, in the case of determining the presence or absence of all the disconnections B1 to Bm in the voltage monitoring module 500, it is necessary to switch the switches m times and to carry out the detection operation m times. Accordingly, it takes a lot of time to detect the disconnections. Thus, when the disconnection detection operation and the measurement of the voltage of each battery cell are repeatedly performed, for example, the measurement of the voltage of each battery cell cannot be carried out for a long period of time due to the disconnection detection operation.

First Embodiment

Figure 6:
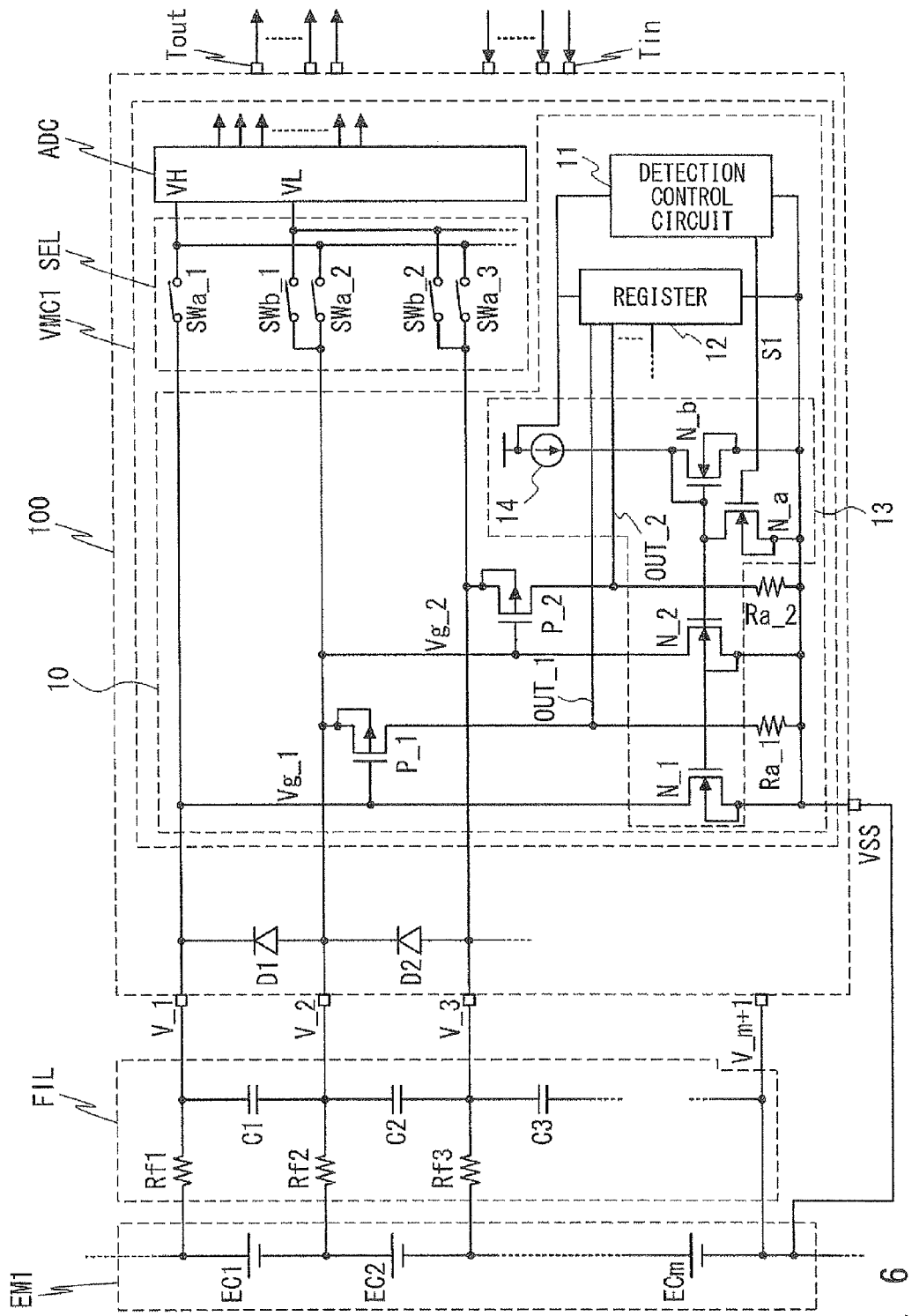
FIG. 6 is a circuit diagram showing a configuration of a main part of a voltage monitoring module 100 according to a first embodiment.

A voltage monitoring module 100 according to a first embodiment will be described below. The voltage monitoring module 100 corresponds to each of the voltage monitoring modules VMM1 to VMMn shown in FIGS. 1 to 3. FIG. 6 is a circuit diagram showing a configuration of a main part of the voltage monitoring module 100 according to the first embodiment. In the voltage monitoring module 100, a voltage measurement circuit VMC1 corresponds to the voltage measurement circuit VMC of the voltage monitoring modules VMM1 to VMMn. For simplification of the explanation, FIG. 6 illustrates the components necessary to understand the configuration and operation of the voltage monitoring module 100.

As compared with the voltage monitoring module VMM1 shown in FIG. 3, the voltage monitoring module 100 has a configuration in which protection diodes D1 to Dm and a disconnection detection circuit 10 are added to the voltage measurement circuit VMC1. Note that in FIG. 6, the illustration of each of the register VMC_REG, the communication circuit VMM_C, and the control circuit VMC_CON is omitted.

For simplification of the explanation, FIG. 6 illustrates only the protection diodes D1 to D3. The anodes of the protection diodes D1 to Dm are respectively connected to the input terminals V_2 to V_m+1. The cathodes of the protection diodes D1 to Dm are respectively connected to the input terminals V_1 to V_m. Accordingly, when an overvoltage is applied to the input terminals V_1 to V_m, the protection diodes D1 to Dm break down to thereby prevent application of the overvoltage to the voltage monitoring module 100.

The disconnection detection circuit 10 includes PMOS transistors P_1 to P_m−1, resistors Ra_1 to Ra_m−1, a detection control circuit 11, a register 12, and an activation circuit 13. For simplification of the explanation, FIG. 6 illustrates only the NMOS transistors N_1 and N_2, the PMOS transistors P_1 and P_2, the resistors Ra_1 and Ra_2, the detection control circuit 11, the activation circuit 13, and the register 12.

The sources of the PMOS transistors P_1 to P_m−1 are respectively connected to the input terminals V_2 to V_m. The drains of the PMOS transistors P_1 to P_m−1 are connected to a ground terminal VSS through the resistors Ra_1 to Ra_m−1, respectively. The drains (nodes OUT_1 to OUT_m−1) of the PMOS transistors P_1 to P_m−1 are connected to the register 12. The gates of the PMOS transistors P_1 to P_m−1 are respectively connected to the drains of the NMOS transistors N_1 to N_m−1. Voltages applied to the gates of the PMOS transistors P_1 to P_m−1 are hereinafter referred to as Vg_1 to Vg_m−1, respectively.

The activation circuit 13 includes the NMOS transistors N_1 to N_m−1, NMOS transistors N_a and N_b, and a current source 14. The drains of the NMOS transistors N_1 to N_m−1 are respectively connected to the input terminals V_1 to V_m−1. The sources of the NMOS transistors N_1 to N_m−1 are each connected to the ground terminal VSS. The current source 14 is connected between the power supply circuit VMM1 and the drain of the NMOS transistor N_b, and outputs a current I. The drain of the NMOS transistor N_b is connected to the gate of the NMOS transistor N_b and to the gates of the NMOS transistors N_1 to N_m−1. The source of the NMOS transistor N_b is connected to the ground terminal VSS. That is, the NMOS transistor N_b and the NMOS transistors N_1 to N_m−1 constitute a current mirror circuit. The drain of the NMOS transistor N_a is connected to the gates of the NMOS transistors N_1 to N_m−1 and N_b. The source of the NMOS transistor N_a is connected to the ground terminal VSS.

The detection control circuit 11 controls turning on/off of the activation circuit 13 according to a control signal S1. The control signal S1 is applied from the detection control circuit 11 to the gate of the NMOS transistor N_a. The register 12 stores levels of signals output from connection nodes (nodes OUT_1 to OUT_m−1) between the PMOS transistors P_1 to P_m−1 and the resistors Ra_1 to Ra_m−1. The other components of the voltage monitoring module 100 are similar to those of the voltage monitoring modules VMM1 to VMMn shown in FIGS. 1 to 3, so the description thereof is omitted.

A filter circuit FIL that is composed of resistors Rf1 to Rfm and capacitors C1 to Cm is disposed between the voltage monitoring module 100 and the battery module EM1.

Figure 7:
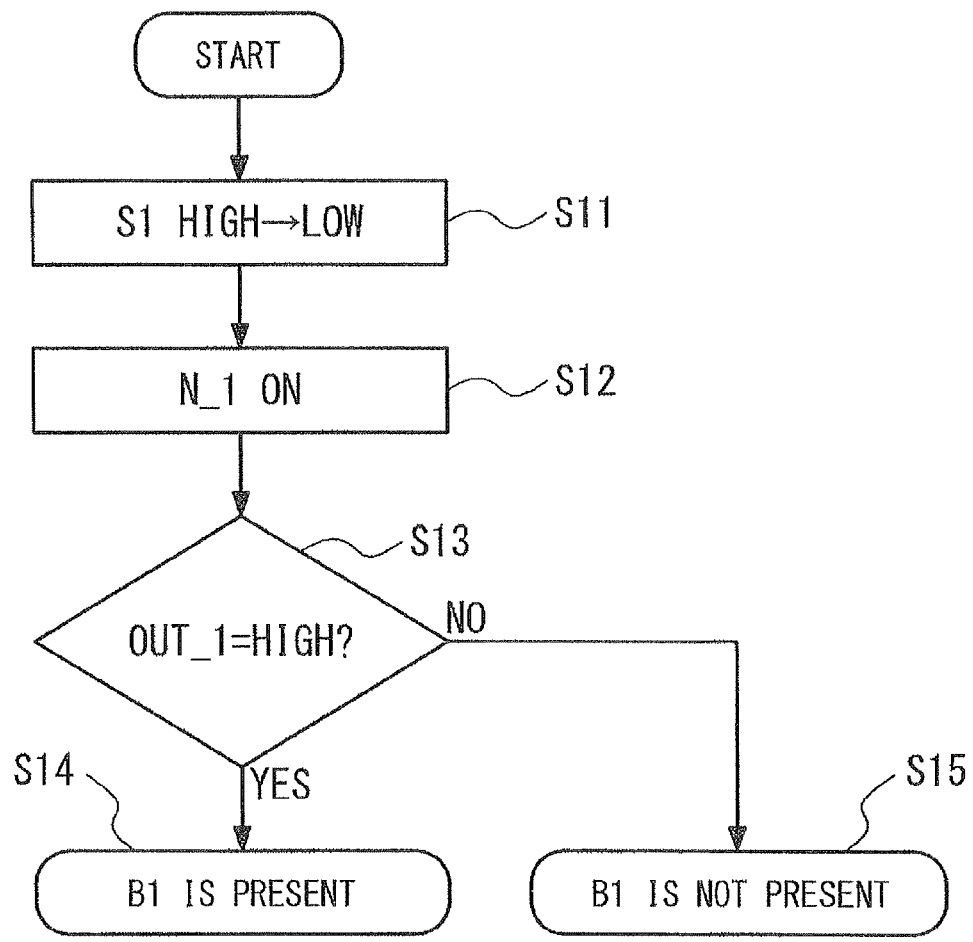
FIG. 7 is a flowchart showing a disconnection detection operation of the voltage monitoring module 100.

Subsequently, a disconnection detection operation of the voltage monitoring module 100 will be described. FIG. 7 is a flowchart showing the disconnection detection operation of the voltage monitoring module 100. First, the detection control circuit 11 switches the level of the control signal S1 from HIGH to LOW (step S11 in FIG. 7). This allows the NMOS transistors N_1 to N_m−1 of the activation circuit 13 to turn on (step S12 in FIG. 7). Specifically, when the control signal S1 is switched from HIGH to LOW, the NMOS transistor N_a turns off. Accordingly, the gates of the NMOS transistors N_1 to N_m−1 are at HIGH level and the NMOS transistors N_1 to N_m−1 turn on.

Figure 8:
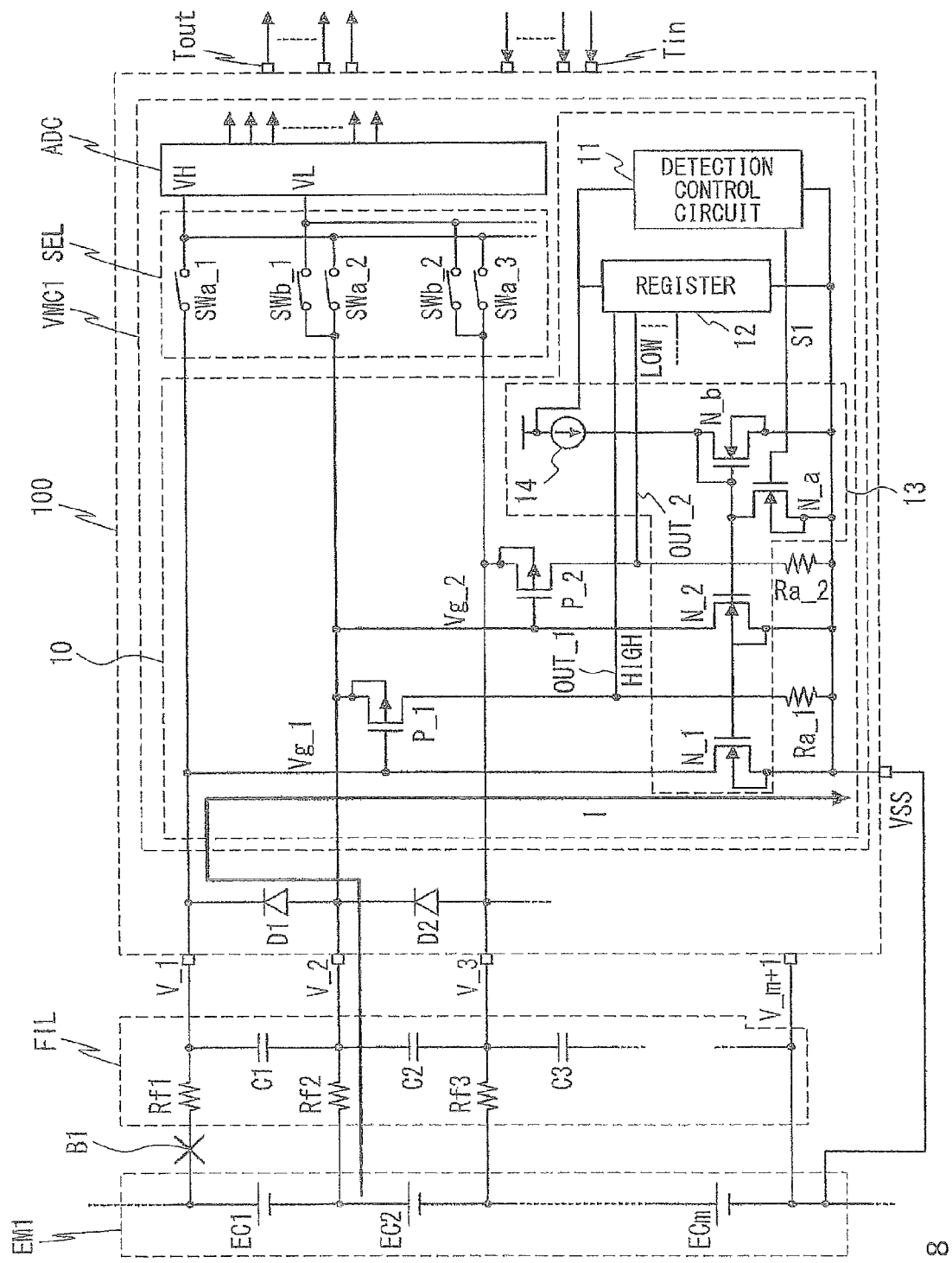
FIG. 8 is a circuit diagram showing a flow of a current in the voltage monitoring module 100 when a disconnection detection circuit 10 turns on in the state where the disconnection B1 is occurring.
Figure 9:
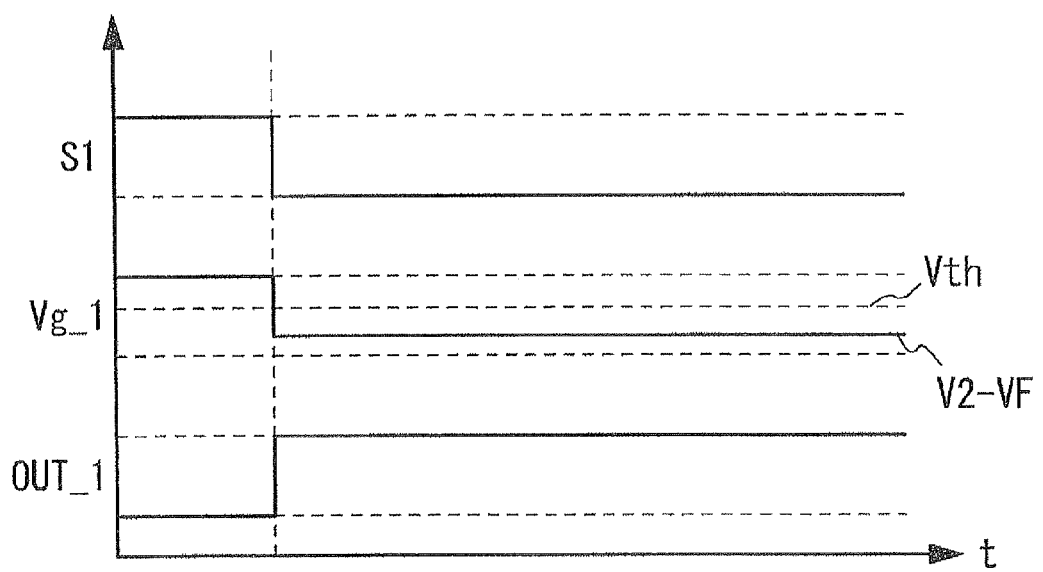
FIG. 9 is a timing diagram showing the disconnection detection operation of the voltage monitoring module 100 when the disconnection detection circuit 10 turns on in the state where the disconnection B1 is occurring.

The disconnection detection operation of the voltage monitoring module 100 will be described below for each of the following cases: the case where the disconnection B1 is occurring; and the case where the disconnection B1 is not occurring. First, the case where the disconnection B1 is occurring between the high-potential-side terminal of the battery cell EC1 and the input terminal V_1 will be described. FIG. 8 is a circuit diagram showing a flow of a current in the voltage monitoring module 100 when the disconnection detection circuit 10 turns on in the state where the disconnection B1 is occurring. FIG. 9 is a timing diagram showing the disconnection detection operation of the voltage monitoring module 100 when the disconnection detection circuit 10 turns on in the state where the disconnection B1 is occurring.

The disconnection B1 is occurring between the high-potential-side terminal of the battery cell EC1 and the input terminal V_1. Accordingly, the voltage of the input terminal V_1 decreases to be lower than that of the input terminal V_2. Then, a current starts flowing through the protection diode D1. Since the NMOS transistor N_1 and the NMOS transistor N_b constitute a current mirror circuit, the current I flows through the protection diode D1 and the NMOS transistor N_1.

At this time, in the protection diode D1, the voltage drop VF occurs with respect to the voltage of the input terminal V_2. In other words, the protection diode D1 functions as a voltage control circuit. Thus, assuming that the voltage of the input terminal V_2 is V2, a voltage (V2−VF) is applied to the gate of the PMOS transistor P_1. In this case, an ON-resistance of each of the protection diode D1 and the NMOS transistor N1 is preliminarily set such that a threshold voltage Vth of the PMOS transistor P_1 satisfies Vth>(V2−VF). Accordingly, when the disconnection B1 occurs, the PMOS transistor P_1 turns on and a current flows through each of the PMOS transistor P_1 and the resistor Ra_1. Thus, the level of the connection node (node OUT_1) between the PMOS transistor P_1 and the resistor Ra_1 becomes HIGH (step S13 in FIG. 7). Therefore, when the disconnection B1 is occurring, HIGH, i.e., "1" is written into the register 12 (step S14 in FIG. 7).

Figure 10:
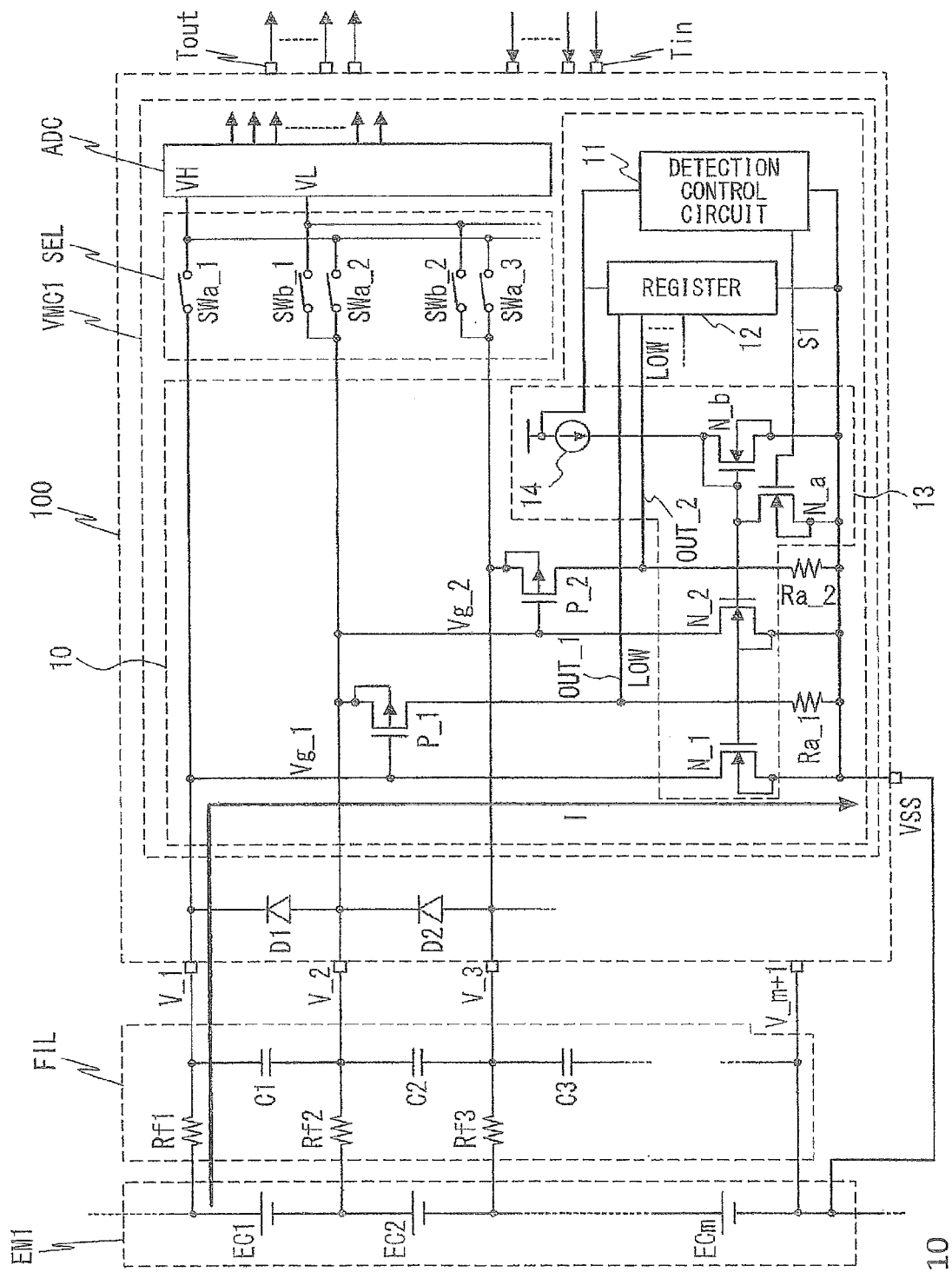
FIG. 10 is a circuit diagram showing a flow of a current in the voltage monitoring module 100 when the disconnection detection circuit 10 turns on in the state where the disconnection B1 is not occurring.
Figure 11:
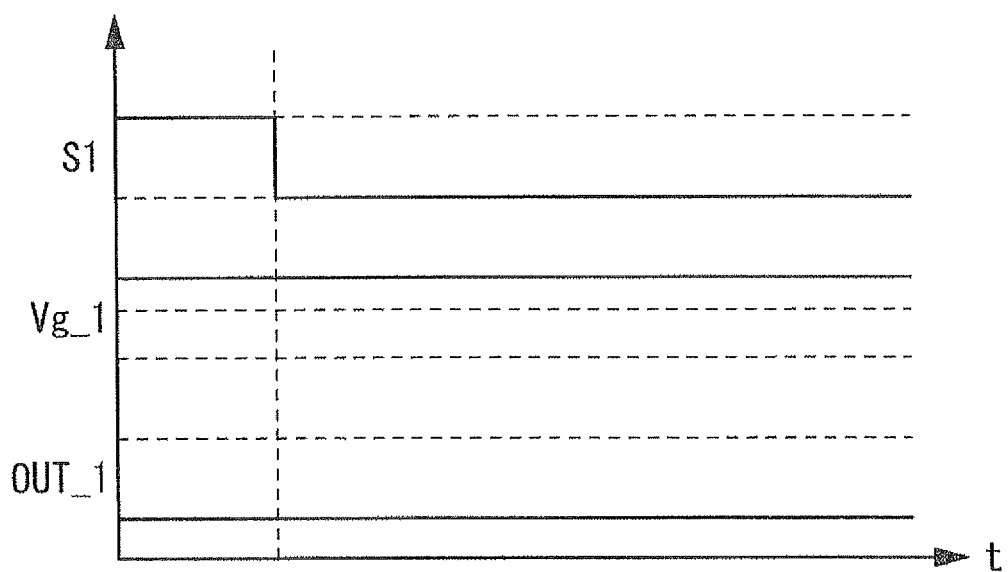
FIG. 11 is a timing diagram showing the disconnection detection operation of the voltage monitoring module 100 when the disconnection detection circuit 10 turns on in the state where the disconnection B1 is not occurring.

Subsequently, the case where the disconnection is not occurring between the high-potential-side terminal of the battery cell EC1 and the input terminal V_1 will be described. FIG. 10 is a circuit diagram showing a flow of a current in the voltage monitoring module 100 when the disconnection detection circuit 10 turns on in the state where the disconnection B1 is not occurring. FIG. 11 is a timing diagram showing the disconnection detection operation of the voltage monitoring module 100 when the disconnection detection circuit 10 turns on in the state where the disconnection B1 is not occurring.

The disconnection B1 is not occurring between the high-potential-side terminal of the battery cell EC1 and the input terminal V_1. In this case, the voltage of the input terminal V_1 is higher than the input terminal V_2, so that no current flows through the protection diode D1. Since the NMOS transistor N_1 and the NMOS transistor N_b constitute a current mirror circuit, the current I flows from the input terminal V_1 to the NMOS transistor N_1.

At this time, assuming that the voltage of the input terminal V_1 is V1, the voltage V1 is applied to the gate of the PMOS transistor P_1. In this case, an ON-resistance of each of the protection diode D1 and the NMOS transistor N_1 is preliminarily set such that the threshold voltage Vth of the PMOS transistor P_1 satisfies Vth<V1. Accordingly, when the disconnection B1 is not occurring, the PMOS transistor P_1 turns off and no current flows through each of the PMOS transistor P_1 and the resistor Ra_1. Thus, the level of the connection node (node OUT_1) between the PMOS transistor P_1 and the resistor Ra_1 is pulled down to LOW (step S13 in FIG. 7). Therefore, when the disconnection B1 is not occurring, LOW, i.e., "0" is written into the register 12 (step S15 in FIG. 7).

As described above, the presence or absence of occurrence of the disconnection B between the high-potential-side terminal of the battery cell EC1 and the input terminal V_1 can be determined based on the value written into the register.

Similarly, when disconnections B2 to Bm−1 are occurring between the high-potential-side terminals of the battery cells EC2 to ECm−1 and the input terminals V_2 to V_m−1, the level of each connection node between the PMOS transistors P_2 to P_m−1 and the resistors Ra_2 to Ra_m−1 becomes HIGH. Accordingly, when the disconnections B2 to Bm−1 are occurring, HIGH, i.e., "1" is written into the register 12.

When the disconnections B2 to Bm−1 are not occurring, the level of each connection node between the PMOS transistors P_2 to P_m−1 and the resistors Ra_2 to Ra_m−1 becomes LOW. Accordingly, when the disconnections B2 to Bm−1 are not occurring, LOW, i.e., "0" is written into the register 12.

That is, the presence or absence of occurrence of the disconnections B1 to Bm−1 between the high-potential-side terminals of the battery cells EC1 to ECm−1 and the input terminals V_1 to V_m−1 can be simultaneously determined by turning on the disconnection detection circuit 10.

FIG. 12A is a diagram schematically showing a disconnection detection operation time of the voltage monitoring module 100 according to the first embodiment. In the voltage monitoring module 100, the presence or absence of the disconnections B1 to Bm−1 is simultaneously determined in a disconnection detection operation period 112 with respect to a voltage measurement period 111 of the battery cells EC1 to ECm. As a result, the disconnection detection operation period 112 can be drastically shortened as compared with the voltage measurement period 111 of the battery cells EC1 to ECm.

FIG. 12B is a diagram schematically showing a disconnection detection operation time of the typical voltage monitoring module 500 described above. The voltage monitoring module 500 sequentially determines the presence or absence of the disconnections B1 to Bm in a disconnection detection operation period 114 with respect to a voltage measurement period 113 of the battery cells EC1 to ECm. Accordingly, the disconnection detection operation period 114 having substantially the same length as the voltage measurement period 113 of the battery cells EC1 to ECm is required.

Therefore, since the voltage monitoring module 100 simultaneously determines the presence or absence of the disconnections B1 to Bm−1 in the disconnection detection operation period 112, the disconnection detection operation period can be drastically reduced as compared with the typical voltage monitoring module 500.

Second Embodiment

Next, a voltage monitoring module 200 according to the second embodiment will be described. The voltage monitoring module 200 is a modified example of the voltage monitoring module 100 according to the first embodiment. FIG. 13 is a circuit diagram showing a configuration of a main part of the voltage monitoring module 200 of the second embodiment. In the voltage monitoring module 200, a voltage measurement circuit VMC2 corresponds to the voltage measurement circuit VMC1 of the voltage monitoring module 100. For simplification of the explanation, FIG. 13 illustrates the components necessary to understand the configuration and operation of the voltage monitoring module 200. Specifically, FIG. 13 illustrates only the circuit elements and circuit blocks associated with the input terminals V_m to V_m+1.

The voltage monitoring module 200 has a configuration in which the disconnection detection circuit 10 of the voltage monitoring module is replaced with a disconnection detection circuit 20. The disconnection detection circuit 20 has a configuration in which PMOS transistors P_m, Pb_1, and Pb_2, a resistor Ra_m, and an inverter INV1 are added to the disconnection detection circuit 10 and the activation circuit 13 is replaced with an activation circuit 23. The activation circuit 23 has a configuration in which an NMOS transistor N_m is added to the activation circuit 13.

The source of the PMOS transistor Pb_1 is connected to the input terminal V_m. The drain of the PMOS transistor Pb_1 is connected to the drain of the NMOS transistor N_m of the activation circuit 23. The source of the NMOS transistor N_m is connected to the ground terminal VSS. The gate of the NMOS transistor N_m is connected to the drain of the NMOS transistor N_a of the activation circuit 23.

The source of the PMOS transistor Pb_2 is connected to the input terminal V_m. The drain of the PMOS transistor Pb_2 is connected to the ground terminal VSS. The gates of the PMOS transistors Pb_1 and Pb_2 are connected to the source of the PMOS transistor Pb_2 and constitute a current mirror circuit.

The source of the PMOS transistor P_m is connected to the input terminal V_m. The drain of the PMOS transistor P_m is connected to the ground terminal VSS through the resistor Ra_m. The drain of the PMOS transistor P_m is connected to the register 12 through the inverter INV1. The output voltage of the inverter INV1 is hereinafter referred to as OUT_m. The gate of the PMOS transistor P_m is connected to the drain of the PMOS transistor Pb_2. A voltage applied to the gate of the PMOS transistor P_m is hereinafter referred to as Vg_m.

The other components of the disconnection detection circuit 20 are similar to those of the disconnection detection circuit 10, so the description thereof is omitted.

Subsequently, the operation of the voltage monitoring module 200 will be described. FIG. 14 is a flowchart showing the disconnection detection operation of the voltage monitoring module 200. First, the detection control circuit 11 switches the level of the control signal S1 from HIGH to LOW (step S21 in FIG. 14) in the same manner as in step S11. This allows the NMOS transistor N_m of the activation circuit 23 to turn on (step S22 in FIG. 14). Specifically, when the control signal S1 is switched from HIGH to LOW, the NMOS transistor N_a turns off. Accordingly, the gate of the NMOS transistor N_m becomes HIGH and the NMOS transistor N_m turns on.

The disconnection detection operation of the voltage monitoring module 200 will be described below for each of the following cases: the case where the disconnection Bm is occurring; and the case where the disconnection Bm is not occurring. First, the case where the disconnection is occurring between the high-potential-side terminal of the battery cell ECm and the input terminal V_m. FIG. 15 is a circuit diagram showing a flow of a current in the voltage monitoring module 200 when the disconnection detection circuit 20 turns on in the state where the disconnection Bm is occurring. FIG. 16 is a timing diagram showing the disconnection detection operation of the voltage monitoring module 200 when the disconnection detection circuit 20 turns on in the state where the disconnection Bm is occurring.

The disconnection Bm is occurring between the high-potential-side terminal of the battery cell ECm and the input terminal V_m. Accordingly, the entire disconnection detection circuit 20 has the same potential as that of the low-potential-side terminal of the battery cell ECm, i.e., the ground terminal VSS. Thus, the level of the connection node between the PMOS transistor P_m and the resistor Ra_m becomes LOW (step S23 in FIG. 14). Therefore, HIGH, i.e., "1" is written into the register 12 through the inverter INV1 (S24 in FIG. 14).

Subsequently, the case where the disconnection is not occurring between the high-potential-side terminal of the battery cell ECm and the input terminal V_m will be described. FIG. 17 is a circuit diagram showing a flow of a current in the voltage monitoring module 200 when the disconnection detection circuit 20 turns on in the state where the disconnection is not occurring. FIG. 18 is a timing diagram showing the disconnection detection operation of the voltage monitoring module 200 when the disconnection detection circuit 20 turns on in the state where the disconnection is not occurring.

The disconnection Bm is not occurring between the high-potential-side terminal of the battery cell ECm and the input terminal V_m. In this case, the voltage of the input terminal V_m is higher than that of the input terminal V_m+1. Since the NMOS transistor N_m and the NMOS transistor N_b constitute a current mirror circuit, the current I flows from the input terminal V_m to the PMOS transistor Pb_2.

At this time, assuming that the voltage of the input terminal V_m is Vm, the voltage Vm is applied to the gate of the PMOS transistor P_m. In this case, the threshold voltage Vth of the PMOS transistor P_m satisfies Vth<Vm. Accordingly, when the disconnection Bm is not occurring, the PMOS transistor P_m turns on and a current flows through each of the PMOS transistor P_m and the resistor Ra_m. Thus, the level of the connection node between the PMOS transistor P_m and the resistor Ra_m becomes HIGH (step S23 in FIG. 14). Therefore, LOW, i.e., "0" is written into the register 12 through the inverter INV1 (step S25 in FIG. 14).

As described above, the presence or absence of occurrence of the disconnection B between the high-potential-side terminal of the battery cell ECm and the input terminal V_m can be determined based on the value written into the register 12.

That is, the presence or absence of occurrence of the disconnections B1 to Bm−1 as well as the disconnection Bm between the high-potential-side terminal of the battery cell ECm and the input terminal V_m can be simultaneously determined by turning on the disconnection detection circuit 20.

Thus, the voltage monitoring module 200 simultaneously determines the presence or absence of the disconnections B1 to Bm in the disconnection detection operation period 112. This makes it possible to drastically reduce the disconnection detection operation period as compared with the typical voltage monitoring module 500. Moreover, the voltage monitoring module 200 can detect the disconnection Sm. Therefore, the voltage monitoring module 200 enables disconnection detection in a wider range than the voltage monitoring module 100.

Third Embodiment

Next, a voltage monitoring module 300 according to a third embodiment will be described. The voltage monitoring module 300 is a modified example of the voltage monitoring module 100 according to the first embodiment. The voltage monitoring module 300 differs from the voltage monitoring module 100 in that the voltage monitoring module 300 has a self-diagnosis function of a disconnection detection circuit.

FIG. 19 is a circuit diagram showing a configuration of a main part of the voltage monitoring module 300 according to the third embodiment. For simplification of the explanation, FIG. 19 illustrates the components necessary to understand the configuration and operation of the voltage monitoring module 300. Specifically, FIG. 19 illustrates only circuit elements and circuit blocks associated with the input terminals V_1 to V_3. In the voltage monitoring module 300, a voltage measurement circuit VMC3 corresponds to the voltage measurement circuit VMC1 of the voltage monitoring module 100.

The voltage monitoring module 300 has a configuration in which the disconnection detection circuit 10 of the voltage monitoring module is replaced with a disconnection detection circuit 30. The disconnection detection circuit 30 has a configuration in which the detection control circuit 11 and the activation circuit 13 of the disconnection detection circuit 10 are respectively replaced with a detection control circuit 31 and an activation circuit 33. The activation circuit 33 has a configuration in which a switch SW and a current source 15 are added.

The switch SW is disposed between the drain of the NMOS transistor N_b and the current sources 14 and 15. The switch SW connects the current source 14 or 15 to the drain of the NMOS transistor N_b according to a control signal S2 from the detection control circuit 31. The current source 15 outputs a current having a value larger than that of the current source 14. For example, the current value of the current source 14 is 0.1 mA, and the current value of the current source 15 is 1 mA. Hereinafter, a current flowing through the current source 14 is referred to as I1 and a current flowing through the current source 15 is referred to as I2 (I2>I1).

Subsequently, the operation of the voltage monitoring module 300 will be described. A disconnection detection operation is carried out using the current source 14 of the voltage monitoring module 300. First, the detection control circuit 31 switches the level of the control signal S1 from HIGH to LOW. This allows the NMOS transistors N_1 to N_m−1 of the activation circuit 33 to turn on in the same manner as in the voltage monitoring module 100. The detection control circuit 31 connects the current source 14 to the drain of the NMOS transistor N_b according to the control signal S2. In this case, the voltage monitoring module 300 performs the disconnection detection operation similar to that of the voltage monitoring module 100. Specifically, HIGH is input to the register 12 when a disconnection is detected, and LOW is input to the register 12 when no disconnection is detected. The disconnection detection operation of the voltage monitoring module 300 is similar to that of the voltage monitoring module 100, so the description thereof is omitted.

The voltage monitoring module 300 performs the self-diagnosis operation of the disconnection detection circuit 30 in addition to the disconnection detection operation. FIG. 20 is a flowchart showing the self-diagnosis operation of the voltage monitoring module 300. Specifically, when the level of the control signal S1 is LOW, i.e., when the NMOS transistors N_1 to N_m−1 of the activation circuit 33 turn on (step S31 in FIG. 20), the detection control circuit 31 connects the current source 15 to the drain of the NMOS transistor N_b according to the control signal S2 (step S32 in FIG. 20). The detection control circuit 31 switches the control signal S2 from LOW to HIGH, thereby connecting the current source 15 to the drain of the NMOS transistor N_b.

The current value I2 of the current source 15 is set to a value capable of turning on the transistors P_1 to Pm−1 even when the disconnections B1 to Bm−1 are not occurring. Accordingly, unless a failure occurs in the disconnection detection circuit 30, the PMOS transistors P_1 to Pm−1 turn on, and HIGH, i.e., "1" is written into the register 12.

Meanwhile, when a failure occurs in the disconnection detection circuit 30, a situation occurs in which LOW, i.e., "0" is written into the register 12. FIG. 21 is a circuit diagram of the voltage monitoring module 300 when a leakage failure L1 occurs in the disconnection detection circuit. In this case, a short-circuit occurs between both terminals of the resistor Ra_1 due to the leakage failure L1, and LOW is input as OUT_1 to the register 12. In other words, due to the presence of the leakage failure L1, LOW is input as OUT_1 to the register 12 even when the PMOS transistor P_1 turns on (steps S33 and S34 in FIG. 20).

In this case, even when the disconnection B1 is present in the disconnection detection operation and the PMOS transistor P_1 turns on, LOW is input as OUT_1 to the register 12. As a result, when the leakage failure L1 is present, the presence of the disconnection B1 cannot be detected. Similarly, when leakage failures L2 to Lm−1 which cause a short-circuit between the both terminals of the resistor Ra_2-Ra_m−1 are present, each of the disconnections B2 to Bm−1 cannot be detected.

On the other hand, when LOW is not input to the register 12, the leakage failures L1 to Lm−1 are not present and it can be determined that the disconnection detection circuit 30 is normal (steps S33 and S35 in FIG. 20).

As described above, in the self-diagnosis operation, when a current that originally allows the PMOS transistors P_1 to P_m−1 to turn on is supplied, the presence or absence of a low-level signal to be input to the register 12 is detected, thereby enabling detection of the presence or absence of a leakage failure.

Thus, according to the voltage monitoring module 300, it is possible to provide a voltage monitoring module capable of further detecting the presence or absence of occurrence of a failure in the disconnection detection circuit 30, and having a more excellent failure detection ability.

Fourth Embodiment

Next, a voltage monitoring module 400 according to a fourth embodiment will be described. The voltage monitoring module 400 is a modified example of the voltage monitoring module 200 according to the second embodiment. The voltage monitoring module 400 differs from the voltage monitoring module 200 in that the voltage monitoring module 400 has a self-diagnosis function of a disconnection detection circuit.

FIG. 22 is a circuit diagram showing a configuration of a main part of the voltage monitoring module 400 according to the fourth embodiment. For simplification of the explanation, FIG. 22 illustrates the components necessary to understand the configuration and operation of the voltage monitoring module 400. Specifically, FIG. 22 illustrates only the circuit elements and circuit blocks associated with the input terminals V_m to V_m+1 and the cell balancing input terminal VBm. In the voltage monitoring module 400, a voltage measurement circuit VMC4 corresponds to the voltage measurement circuit VMC1 of the voltage monitoring module 100.

The voltage monitoring module 400 has a configuration in which the disconnection detection circuit 20 of the voltage monitoring module is replaced with a disconnection detection circuit 40. The disconnection detection circuit 40 has a configuration in which the detection control circuit 11 and the activation circuit 23 of the disconnection detection circuit 20 are respectively replaced with a detection control circuit 41 and an activation circuit 43.

The activation circuit 43 has a configuration in which the switch SW and the current source 15 are added to the activation circuit 23. As with the activation circuit 33 according to the third embodiment, the switch SW is disposed between the drain of the NMOS transistor N_b and the current sources 14 and 15. The switch SW connects the current source 14 or 15 to the drain of the NMOS transistor N_b according to the control signal S2 from the detection control circuit 41. As with the activation circuit 33 according to the third embodiment, the current source 15 outputs a current having a value larger than that of the current source 14. For example, the current value of the current source 14 is 0.1 mA, and the current value of the current source 15 is 1 mA. Hereinafter, a current flowing through the current source 14 is referred to as I1, and a current flowing through the current source 15 is referred to as I2 (I2>I1).

Subsequently, the operation of the voltage monitoring module 400 will be described. A disconnection detection operation is carried out using the current source 14 of the voltage monitoring module 400. First, the detection control circuit 41 switches the level of the control signal S1 from HIGH to LOW. As a result, in the same manner as in the voltage monitoring module 100, the NMOS transistor N_m of the activation circuit 43 turns on. The detection control circuit 41 connects the current source 14 to the drain of the NMOS transistor N_b according to the control signal S2. In this case, the voltage monitoring module 400 performs the disconnection detection operation similar to that of the voltage monitoring module 200. Specifically, HIGH is input to the register 12 when a disconnection is detected, and LOW is input to the register 12 when no disconnection is detected. The disconnection detection operation of the voltage monitoring module 400 is similar to that of the voltage monitoring module 200, so the description thereof is omitted.

The voltage monitoring module 400 performs the self-diagnosis operation of the disconnection detection circuit 40 in addition to the disconnection detection operation. Regarding the self-diagnosis operation of the disconnection detection circuit 40, an open failure OP of the PMOS transistor Pb_2 will be described below by way of example. FIG. 23 is a flowchart showing the self-diagnosis operation of the voltage monitoring module 400. Specifically, when the level of the control signal S1 is LOW, i.e., in the state where the NMOS transistors N_1 to N_m turn on (step S41 in FIG. 23), the detection control circuit 41 connects the current source 15 to the drain of the NMOS transistor N_b according to the control signal S2 (step S42 in FIG. 23).

Even when the disconnections B1 to Bm are not occurring, the current value I2 of the current source 15 is set to a value capable of turning on the PMOS transistors P_1 to Pm. Accordingly, unless a failure occurs in the disconnection detection circuit 40, the PMOS transistor Pm turns on, and HIGH, i.e., "1" is written into the register 12.

However, when the open failure OP of the PMOS transistor Pb_2 is occurring, LOW, i.e., "0" is written into the register 12. FIG. 24 is a circuit diagram of the voltage monitoring module 400 when the open failure OP is occurring in the disconnection detection circuit 40. In this case, the gate voltage (Vg_m) of the PMOS transistor P_m becomes LOW due to the open failure OP of the PMOS transistor Pb_2, and LOW is input to the register 12. That is, due to the presence of the open failure OP of the PMOS transistor Pb_2, LOW is input as OUT_m to the register 12.

In this case, even when the disconnection Bm is present in the disconnection detection operation, LOW is input as OUT_m to the register 12 due to the open failure OP of the PMOS transistor Pb_2 (steps S43 and S44 in FIG. 23). As a result, when the open failure OP of the PMOS transistor Pb_2 is present, the presence of the disconnection Bm cannot be detected.

On the other hand, when LOW is not input to the register 12, the open failure OP of the PMOS transistor Pb_2 is not present, and it can be determined that the disconnection detection circuit 40 is normal (steps S43 and S45 in FIG. 23).

As described above, in the self-diagnosis operation, the presence or absence of the open failure OP of the PMOS transistor Pb_2 can be further detected.

Therefore, according to the voltage monitoring module 400, it is possible to provide a voltage monitoring module capable of detecting not only the leakage failures L1 to Lm−1 but also the open failure OP of the PMOS transistor Pb_2 in the disconnection detection circuit 40, and having a more excellent failure detection ability.

The present invention is not limited to the embodiments described above, and can be modified as appropriate without departing from the scope of the invention. For example, the example in which MOS transistors are also used in the disconnection detection circuit has been described above, but other transistors may also be used as needed.

Further, the operation of the detection control circuit can be controlled by a signal from the cell monitoring unit CMU outside the voltage monitoring module. For example, the cell monitoring unit CMU can instruct the detection control circuit to execute both or one of a wire detection operation and a self-diagnosis operation.

Furthermore, when a disconnection is detected in the voltage monitoring module, the disconnection detection result can be notified to each of the battery management unit BMU and the engine control unit ECU via the cell monitoring unit CMU. In this case, the voltage of each battery cell cannot be monitored due to the disconnection. Accordingly, the battery management unit BMU or the engine control unit ECU may control the relays REL1 and REL2 or the inverter INV to thereby stop charging of each battery cell.

The whole or part of the embodiments disclosed above can be described as, but not limited to, the following supplementary notes.

(Supplementary Note 1)

A voltage monitoring module comprising:

m (m is an integer equal to or greater than 2) input terminals respectively connected to high-potential-side terminals of m battery cells connected in series;

a ground terminal that receives a voltage of a low-potential-side terminal of a lowermost battery cell of the m battery cells;

(m−1) voltage control circuits that are each connected between two adjacent input terminals of the m input terminals and cause a current to flow to generate a predetermined voltage drop when a voltage of a k-th (k is an integer equal to or greater than 2 and equal to or less than m) input terminal counted from a high potential side is higher than a voltage of a (k−1)-th input terminal counted from the high potential side; and a disconnection detection circuit that detects a disconnection between each of the high-potential-side terminals of the m battery cells connected in series and each of the m input terminals, wherein the disconnection detection circuit comprises:

an activation circuit that is disposed between the m input terminals and the ground terminal and controls a flow of m currents flowing between each of the m input terminals and the ground terminal;

(m−1) first switches having first terminals respectively connected to the second to m-th input terminals counted from the high potential side; second terminals that output signals; and control terminals respectively connected to the first to (m−1)-th input terminals counted from the high potential side, the (m−1) first switches being configured to turn on when a voltage applied to the control terminals is smaller than a predetermined value; and a memory unit connected to each of the second terminals of the (m−1) first switches.

(Supplementary Note 2)

The voltage monitoring module according to Supplementary note 1, wherein the activation circuit causes the m currents flowing between each of the m input terminals and the ground terminal to collectively flow or to be interrupted.

(Supplementary Note 3)

The voltage monitoring module according to Supplementary note 1, wherein the voltage control circuit is a diode having an anode connected to the k-th input terminal counted from the high potential side, and a cathode connected to the (k−1)-th input terminal counted from the high potential side.

(Supplementary Note 4)

The voltage monitoring module according to Supplementary note 1, wherein the first switches are transistors each having the first terminal connected to the k-th input terminal counted from the high potential side, and the second terminal connected to the memory unit, a current flowing through the transistors when a voltage applied to the control terminals is smaller than a threshold voltage.

(Supplementary Note 5)

The voltage monitoring module according to Supplementary note 4, further comprising (m−1) first resistors connected between each of the (m−1) first switches and the ground terminal.

(Supplementary Note 6)

The voltage monitoring module according to Supplementary note 5, wherein the second terminals of the first switches are connected to the ground terminal through any of the (m−1) first resistors.

(Supplementary Note 7)

The voltage monitoring module according to Supplementary note 1, wherein the disconnection detection circuit further comprises a detection control circuit that controls an operation of controlling the flow of the m currents of the activation circuit.

(Supplementary Note 8)

The voltage monitoring module according to Supplementary note 7, wherein the activation circuit comprises (m−1) second switches that are connected between each of the first to (m−1)-th input terminals counted from the high potential side and the ground terminal, and are configured to turn on/off with the same logic.

(Supplementary Note 9)

The voltage monitoring module according to Supplementary note 8, wherein the second switches are transistors having one end connected to each of the first to (m−1)-th input terminals counted from the high potential side, and another end connected to the ground terminal, a current flowing through the transistors according to a voltage applied to control terminals of the transistors.

(Supplementary Note 10)

The voltage monitoring module according to Supplementary note 9, wherein the activation circuit further comprises:

a first current source;

a first transistor that is cascade-connected to the first current source and operates with the same logic as that of the transistors constituting the (m−1) second switches; and a second transistor connected between the control terminals of the transistors constituting the (m−1) second switches and the control terminal of the first transistor, and the ground terminal.

(Supplementary Note 11)

The voltage monitoring module according to Supplementary note 10, wherein the detection control circuit outputs, to the activation circuit, a first control signal for controlling an operation of controlling the flow of them currents of the activation circuit.

(Supplementary Note 12)

The voltage monitoring module according to Supplementary note 11, wherein the first control signal is applied to a control terminal of the second transistor.

(Supplementary Note 13)

The voltage monitoring module according to Supplementary note 12, further comprising:

a third switch having one end connected to the m-th input terminal counted from the high potential side;

a second resistor connected between another end of the third switch and the ground terminal;

a third transistor having one end connected to the m-th input terminal counted from the high potential side;

a fourth transistor connected between the m-th input terminal counted from the high potential side and the ground terminal; and an inverter having an input connected to a node between the third switch and the second resistor, and an output connected to the memory unit, wherein the activation circuit further comprises a fourth switch having one end connected to another end of the third transistor and the control terminals of the third and fourth transistors, and another end connected to the ground terminal, the fourth switch being configured to turn on/off with the same logic as that of the second switch.

(Supplementary Note 14)

The voltage monitoring module according to Supplementary note 13, wherein the fourth switch is a transistor having a control terminal connected to the control terminal of the first transistor.

(Supplementary Note 15)

The voltage monitoring module according to Supplementary note 10, wherein the activation circuit further comprises: a second current source; and a fifth switch that connects one of the first current source and the second current source to the first transistor according to a second control signal from the detection control circuit.

(Supplementary Note 16)

The voltage monitoring module according to Supplementary note 15, wherein the second current source outputs a current to turn on the first switch when no disconnection occurs, upon connection of the second current source to the first transistor, between each of the high-potential-side terminals of the first to (m−1)-th battery cells counted from the high potential side and each of the first to (m−1)-th input terminals counted from the high potential side.

(Supplementary Note 17)

The voltage monitoring module according to Supplementary note 16, wherein the detection control circuit connects the second current source and the first transistor in a state where the second transistor is turned off, and the disconnection detection circuit detects a failure of the disconnection detection circuit when a low-level signal is included in signals to be input to the memory unit from the second terminals of the (m−1) first switches.

(Supplementary Note 18)

The voltage monitoring module according to Supplementary note 13, wherein the activation circuit further comprises: a second current source; and a fifth switch that connects one of the first current source and the second current source to the first transistor according to a second control signal from the detection control circuit.

(Supplementary Note 19)

The voltage monitoring module according to Supplementary note 18, wherein the second current source outputs a current to turn on the first switch and the third switch when no disconnection occurs, upon connection of the second current source to the first transistor, between each of the high-potential-side terminals of the m battery cells and each of the m input terminals.

(Supplementary Note 20)

The voltage monitoring module according to Supplementary note 19, wherein the detection control circuit connects the second current source and the first transistor in a state where the second transistor is turned off, and the disconnection detection circuit detects a failure of the disconnection detection circuit when a low-level signal is included in signals to be input to the memory unit from the second terminals of the (m−1) first switches and signals to be input to the memory unit through the inverter from a node between the third switch and the second resistor.

(Supplementary Note 21)

A voltage monitoring system comprising:

the voltage monitoring module according to Supplementary note 12; and a cell monitoring unit that controls the voltage monitoring module, wherein the cell monitoring unit causes the detection control circuit to turn off the second transistor to thereby detect presence or absence of a disconnection between each of the high-potential-side terminals of the first to (m−1)-th battery cells counted from the high potential side and each of the first to (m−1)-th input terminals counted from the high potential side.

(Supplementary Note 22)

A voltage monitoring system comprising:

the voltage monitoring module according to Supplementary note 13; and a cell monitoring unit that controls the voltage monitoring module, wherein the cell monitoring unit causes the detection control circuit to turn off the second transistor to thereby detect presence or absence of a disconnection between each of the high-potential-side terminals of the m battery cells and each of the m input terminals.

(Supplementary Note 23)

A voltage monitoring system comprising:

the voltage monitoring module according to Supplementary note 18; and a cell monitoring unit that controls the voltage monitoring module, wherein the cell monitoring unit causes the detection control circuit to turn off the second transistor to thereby detect presence or absence of a disconnection between each of the high-potential-side terminals of the m battery cells and each of the m input terminals.

The invention made by the present inventor has been described in detail above with reference to embodiments. However, the present invention is not limited to the embodiments described above and can be modified in various manners without departing from the gist of the invention.

The first to fourth embodiments can be combined as desirable by one of ordinary skill in the art.)

While the invention has been described in terms of several embodiments, those skilled in the art will recognize that the invention can be practiced with various modifications within the spirit and scope of the appended claims and the invention is not limited to the examples described above.

Further, the scope of the claims is not limited by the embodiments described above.

Furthermore, it is noted that, Applicant's intent is to encompass equivalents of all claim elements, even if amended later during prosecution.

What is claimed is:

1. A voltage monitoring module comprising:
   m (m is an integer equal to or greater than 2) input terminals respectively connected to high-potential-side terminals of m battery cells connected in series;
   a ground terminal that receives a voltage of a low-potential-side terminal of a lowermost battery cell of the m battery cells;
   (m−1) voltage control circuits that are each connected between two adjacent input terminals of the m input terminals and cause a current to flow to generate a predetermined voltage drop when a voltage of a k-th (k is an integer equal to or greater than 2 and equal to or less than m) input terminal counted from a high potential side is higher than a voltage of a (k−1)-th input terminal counted from the high potential side; and
   a disconnection detection circuit that detects a disconnection between each of the high-potential-side terminals of the m battery cells connected in series and each of the m input terminals,
   wherein the disconnection detection circuit comprises:
     an activation circuit that is disposed between the m input terminals and the ground terminal and controls a flow of m currents flowing between each of the m input terminals and the ground terminal;
     (m−1) first switches having first terminals respectively connected to the second to m-th input terminals counted from the high potential side; second terminals that output signals; and control terminals respectively connected to the first to (m−1)-th input terminals counted from the high potential side, the (m−1) first switches being configured to turn on when a voltage applied to the control terminals is smaller than a predetermined value; and
     a memory unit connected to each of the second terminals of the (m−1) first switches.

2. The voltage monitoring module according to claim 1, wherein the activation circuit causes the m currents flowing between each of the m input terminals and the ground terminal to collectively flow or to be interrupted.

3. The voltage monitoring module according to claim 1, wherein the voltage control circuit comprises a diode having an anode connected to the k-th input terminal counted from the high potential side, and a cathode connected to the (k−1)-th input terminal counted from the high potential side.

4. The voltage monitoring module according to claim 1, wherein the first switches comprise transistors each having a first terminal connected to the k-th input terminal counted from the high potential side, and a second terminal connected to the memory unit, a current flowing through the transistors when a voltage applied to the control terminals is smaller than a threshold voltage.

5. The voltage monitoring module according to claim 4, wherein the disconnection detection circuit further comprises (m−1) first resistors connected between each of the (m−1) first switches and the ground terminal.

6. The voltage monitoring module according to claim 5, wherein the second terminals of the first switches are connected to the ground terminal through any of the (m−1) first resistors.

7. The voltage monitoring module according to claim 1, wherein the disconnection detection circuit further comprises a detection control circuit that controls an operation of controlling the flow of the m currents of the activation circuit.

8. The voltage monitoring module according to claim 7, wherein the activation circuit comprises (m−1) second switches that are connected between each of the first to (m−1)-th input terminals counted from the high potential side and the ground terminal, and are configured to turn on/off with the same logic.

9. The voltage monitoring module according to claim 8, wherein the second switches are transistors having one end connected to each of the first to (m−1)-th input terminals counted from the high potential side, and another end connected to the ground terminal, a current flowing through the transistors according to a voltage applied to control terminals of the transistors.

10. The voltage monitoring module according to claim 9, wherein the activation circuit further comprises:
    a first current source;
    a first transistor that is cascade-connected to the first current source and operates with the same logic as that of the transistors constituting the (m−1) second switches; and
    a second transistor connected between the control terminals of the transistors constituting the (m−1) second switches and the control terminal of the first transistor, and the ground terminal.

11. The voltage monitoring module according to claim 10, wherein the detection control circuit outputs, to the activation circuit, a first control signal for controlling an operation of controlling the flow of the m currents of the activation circuit.

12. The voltage monitoring module according to claim 11, wherein the first control signal is applied to a control terminal of the second transistor.

13. The voltage monitoring module according to claim 12, wherein
    the disconnection detection circuit further comprises:
      a third switch having one end connected to the m-th input terminal counted from the high potential side;
      a second resistor connected between another end of the third switch and the ground terminal;
      a third transistor having one end connected to the m-th input terminal counted from the high potential side;
      a fourth transistor connected between the m-th input terminal counted from the high potential side and the ground terminal; and an inverter having an input connected to a node between the third switch and the second resistor, and an output connected to the memory unit, and the activation circuit further comprises a fourth switch having one end connected to another end of the third transistor and the control terminals of the third and fourth transistors, and another end connected to the ground terminal, the fourth switch being configured to turn on/off with the same logic as that of the second switch.

14. The voltage monitoring module according to claim 13, wherein the fourth switch comprises a transistor having a control terminal connected to the control terminal of the first transistor.

15. The voltage monitoring module according to claim 10, wherein the activation circuit further comprises:
a second current source; and
a fifth switch that connects one of the first current source and the second current source to the first transistor according to a second control signal from the detection control circuit.

16. The voltage monitoring module according to claim 15, wherein the second current source outputs a current to turn on the first switch when no disconnection occurs, upon connection of the second current source to the first transistor, between each of the high-potential-side terminals of the first to (m−1)-th battery cells counted from the high potential side and each of the first to (m−1)-th input terminals counted from the high potential side.

17. The voltage monitoring module according to claim 16, wherein the detection control circuit connects the second current source and the first transistor in a state where the second transistor is turned off, and the disconnection detection circuit detects a failure of the disconnection detection circuit when a low-level signal is included in signals to be input to the memory unit from the second terminals of the (m−1) first switches.

18. The voltage monitoring module according to claim 13, wherein the activation circuit further comprises:
a second current source; and
a fifth switch that connects one of the first current source and the second current source to the first transistor according to a second control signal from the detection control circuit.

19. The voltage monitoring module according to claim 18, wherein the second current source outputs a current to turn on the first switch and the third switch when no disconnection occurs, upon connection of the second current source to the first transistor, between each of the high-potential-side terminals of the m battery cells and each of the m input terminals.

20. A voltage monitoring system comprising:
age monitoring module according to claim 12; and
a cell monitoring unit that controls the voltage monitoring module,
wherein the cell monitoring unit causes the detection control circuit to turn off the second transistor to thereby detect presence or absence of a disconnection between each of the high-potential-side terminals of the first to (m−1)-th battery cells counted from the high potential side and each of the first to (m−1)-th input terminals counted from the high potential side.

* * * * *